US 10,771,231 B2

(12) United States Patent
Stott et al.

(10) Patent No.: US 10,771,231 B2
(45) Date of Patent: *Sep. 8, 2020

(54) SIGNALING SYSTEM WITH ADAPTIVE TIMING CALIBRATION

(71) Applicant: Rambus Inc., Sunnyvale, CA (US)

(72) Inventors: Bret G. Stott, Menlo Park, CA (US); Craig E. Hampel, Los Altos, CA (US); Frederick A. Ware, Los Altos Hills, CA (US)

(73) Assignee: Rambus Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/584,830

(22) Filed: Sep. 26, 2019

(65) Prior Publication Data

US 2020/0106598 A1 Apr. 2, 2020

Related U.S. Application Data

(63) Continuation of application No. 15/250,685, filed on Aug. 29, 2016, now Pat. No. 10,447,465, which is a (Continued)

(51) Int. Cl.
*H04L 7/033* (2006.01)
*H04L 7/00* (2006.01)
(Continued)

(52) U.S. Cl.
CPC .......... *H04L 7/0337* (2013.01); *G11C 7/1051* (2013.01); *G11C 7/1069* (2013.01);
(Continued)

(58) Field of Classification Search
CPC ..... H04L 7/0337; H04L 7/0037; H04L 1/203; H04L 7/0041; H04L 7/0008
(Continued)

(56) References Cited

U.S. PATENT DOCUMENTS 3,911,368 A 10/1975 Tarczy-Hornoch
4,410,916 A 10/1983 Pratt et al.
(Continued)

FOREIGN PATENT DOCUMENTS

DE 19920335 C1 9/2000
WO WO-98/44674 A1 10/1998
WO WO-99/17183 A1 4/1999

OTHER PUBLICATIONS

Altera, "Using Source-Synchronous Signaling with DPA in Stratix GX Devices," Application Note 236, pp. 1-18, Altera Corporation, Jan. 2003, ver. 1.1, available at http://www.altera.com/literature/an/an236.pdf. 18 pages.

(Continued)

*Primary Examiner* — Fitwi Y Hailegiorgis
(74) *Attorney, Agent, or Firm* — Lance Kreisman; Peninsula Patent Group

(57) ABSTRACT

A signaling system is disclosed. The signaling system includes a first integrated circuit (IC) chip to receive a data signal and a strobe signal. The first IC includes circuitry to sample the data signal at times indicated by the strobe signal to generate phase error information and circuitry to output the phase error information from the first IC device. The system further includes a signaling link and a second IC chip coupled to the first IC chip via the signaling link to output the data signal and the strobe signal to the first IC chip. The second IC chip includes delay circuitry to generate the strobe signal by delaying an aperiodic timing signal for a first time interval and timing control circuitry to receive the phase error information from the first IC chip and adjust the first time interval in accordance with the phase error information.

20 Claims, 18 Drawing Sheets

Related U.S. Application Data continuation of application No. 13/301,383, filed on Nov. 21, 2011, now Pat. No. 9,432,179, which is a continuation of application No. 11/384,148, filed on Mar. 16, 2006, now Pat. No. 8,121,237.

(51) Int. Cl.
| | | |
|---|---|---|
| G11C 7/10 | (2006.01) | |
| G11C 7/20 | (2006.01) | |
| G11C 7/22 | (2006.01) | |
| H03L 7/081 | (2006.01) | |
| H04L 1/20 | (2006.01) | |
| G11C 7/04 | (2006.01) | |

(52) U.S. Cl.
CPC .......... *G11C 7/1078* (2013.01); *G11C 7/1093* (2013.01); *G11C 7/1096* (2013.01); *G11C 7/20* (2013.01); *G11C 7/22* (2013.01); *G11C 7/222* (2013.01); *H03L 7/0814* (2013.01); *H04L 1/203* (2013.01); *H04L 7/0008* (2013.01); *H04L 7/0037* (2013.01); *H04L 7/0041* (2013.01); *G11C 7/04* (2013.01); *G11C 2207/2254* (2013.01); *H04L 7/0004* (2013.01)

(58) Field of Classification Search
USPC .......................................... 375/371; 365/222
See application file for complete search history.

(56) References Cited

U.S. PATENT DOCUMENTS

| | | |
|---|---|---|
| 4,687,954 A | 8/1987 | Yasuda et al. |
| 4,926,447 A | 5/1990 | Corsetto et al. |
| 5,060,239 A | 10/1991 | Briscoe et al. |
| 5,334,883 A | 8/1994 | Rosenthal |
| 5,341,371 A | 8/1994 | Simpson |
| 5,805,619 A | 9/1998 | Gardner et al. |
| 5,917,760 A | 6/1999 | Millar |
| 5,935,257 A | 8/1999 | Nishimura |
| 5,948,083 A | 9/1999 | Gervasi |
| 5,963,606 A | 10/1999 | Drost et al. |
| 6,023,174 A | 2/2000 | Kirsch |
| 6,028,816 A | 2/2000 | Takemae et al. |
| 6,055,587 A | 4/2000 | Asami et al. |
| 6,134,638 A | 10/2000 | Olarig et al. |
| 6,192,492 B1 | 2/2001 | Masiewicz et al. |
| 6,201,423 B1 | 3/2001 | Taguchi |
| 6,279,073 B1 | 8/2001 | McCracken et al. |
| 6,316,980 B1 | 11/2001 | Vogt et al. |
| 6,396,887 B1 | 5/2002 | Ware et al. |
| 6,401,213 B1 | 6/2002 | Jeddeloh |
| 6,466,491 B2 | 10/2002 | Yanagawa |
| 6,498,766 B2 | 12/2002 | Lee et al. |
| 6,512,704 B1 | 1/2003 | Wu et al. |
| 6,552,587 B2 | 4/2003 | Kim et al. |
| 6,570,800 B2 | 5/2003 | Tanaka et al. |
| 6,570,944 B2 | 5/2003 | Best et al. |
| 6,603,686 B2 | 8/2003 | Yoo et al. |
| 6,629,225 B2 | 9/2003 | Zumkehr |
| 6,643,787 B1 | 11/2003 | Zerbe et al. |
| 6,646,929 B1 | 11/2003 | Moss et al. |
| 6,646,953 B1 | 11/2003 | Stark |
| 6,675,272 B2 | 1/2004 | Ware et al. |
| 6,691,214 B1 | 2/2004 | Li et al. |
| 6,707,723 B2 | 3/2004 | Jeong |
| 6,759,881 B2 | 7/2004 | Kizer et al. |
| 6,782,459 B1 | 8/2004 | Ware |
| 6,804,800 B2 | 10/2004 | Rodriguez |
| 6,819,157 B2 | 11/2004 | Cao et al. |
| 6,836,503 B2 | 12/2004 | Best et al. |
| 6,836,521 B2 | 12/2004 | Ware et al. |
| 6,912,680 B1 | 6/2005 | Keeth |
| 6,930,932 B2 | 8/2005 | Rentschler |
| 6,940,760 B2 | 9/2005 | Borkenhagen et al. |
| 6,940,768 B2 | 9/2005 | Dahlberg et al. |
| 6,998,892 B1 | 2/2006 | Nguyen et al. |
| 7,031,205 B2 | 4/2006 | Han et al. |
| 7,062,625 B1 | 6/2006 | Shrader et al. |
| 7,099,989 B2 | 8/2006 | Morzano |
| 7,133,790 B2 | 11/2006 | Liou |
| 7,245,553 B2 | 7/2007 | Lin et al. |
| 7,251,194 B2 | 7/2007 | Lin et al. |
| 7,259,606 B2 | 8/2007 | Ku et al. |
| 7,269,094 B2 | 9/2007 | Lin et al. |
| 7,349,519 B2 | 3/2008 | Fang et al. |
| 7,366,862 B2 | 4/2008 | Nystuen et al. |
| 7,707,484 B2 | 4/2010 | Awaji et al. |
| 10,447,465 B2 * | 10/2019 | Stott ........................ G11C 7/22 |
| 2001/0020278 A1 | 9/2001 | Saito |
| 2001/0052097 A1 | 12/2001 | Miura |
| 2002/0009004 A1 | 1/2002 | Hamada et al. |
| 2002/0149397 A1 | 10/2002 | Dally et al. |
| 2002/0196883 A1 | 12/2002 | Best et al. |
| 2003/0065465 A1 | 4/2003 | Johnson et al. |
| 2003/0091136 A1 | 5/2003 | Sugita |
| 2003/0179611 A1 | 9/2003 | Liou |
| 2003/0184343 A1 | 10/2003 | Kuge |
| 2003/0226053 A1 | 12/2003 | Khieu et al. |
| 2003/0231537 A1 | 12/2003 | Stark |
| 2004/0044919 A1 | 3/2004 | Dabral |
| 2004/0066864 A1 | 4/2004 | Cranford et al. |
| 2004/0084537 A1 | 5/2004 | Best |
| 2004/0158688 A1 | 8/2004 | Rentschler et al. |
| 2004/0187046 A1 * | 9/2004 | Lee ................... G01R 31/31937 713/500 |
| 2004/0203559 A1 | 10/2004 | Stojanovic et al. |
| 2004/0213067 A1 | 10/2004 | Best et al. |
| 2004/0230715 A1 | 11/2004 | Huang |
| 2005/0005056 A1 | 1/2005 | Ware |
| 2005/0071707 A1 | 3/2005 | Hampel |
| 2005/0094462 A1 * | 5/2005 | Jakobs ................. G11C 7/1078 365/222 |
| 2005/0110544 A1 | 5/2005 | Suda et al. |
| 2005/0141294 A1 | 6/2005 | Bonelli |
| 2005/0163203 A1 | 7/2005 | Ware et al. |
| 2005/0188255 A1 | 8/2005 | Kumar et al. |
| 2005/0240744 A1 | 10/2005 | Shaikh et al. |
| 2006/0052961 A1 | 3/2006 | Best |
| 2006/0133523 A1 | 6/2006 | Stojanovic et al. |
| 2006/0184755 A1 | 8/2006 | Lee |
| 2006/0193194 A1 | 8/2006 | Schnell |
| 2007/0008791 A1 | 1/2007 | Butt et al. |
| 2007/0033337 A1 | 2/2007 | Butt et al. |
| 2007/0183552 A1 | 8/2007 | Sanders et al. |
| 2007/0183553 A1 | 8/2007 | Sanders et al. |
| 2009/0154285 A1 | 6/2009 | Pyeon |
| 2009/0154629 A1 | 6/2009 | Pyeon et al. |

OTHER PUBLICATIONS

Chakraborty, Anjanta, "Efficient Self-Timed Interfaces for Crossing Clock Domains," Thesis Submitted to the Department of Computer Science, University of British Columbia (Bhopal Engineering College), Aug. 2003. 74 pages.

Collins et al., "DDR-SDRAM, High-Speed, Source-Synchronous Interfaces Create Design Challenges," EDN, Sep. 2, 1999, pp. 63, 64, 66, 68, 70, 72, available at http://www.ednmag/reg/1999/090299/18ms544.htm. 28 pages.

Dallas Semiconductor, "Tech Brief 31: Using Delay Lines to Generate Multi-Phased Clocks," p. 1, Dec. 11, 2001, available at http://www.maximic.com/appnotes.cfm/appnote_number/880. 1 page.

Find, "DDR-SDRAM-2: Detailed Specifications," Nov. 1998, pp. 1-14, vol. 16, No. 4. 14 pages.

Find, "DDR-SDRAM-4: DLL Circuit Technology," Nov. 1998, pp. 1-4, vol. 16, No. 4. 4 pages.

Horowitz, Hill, "The Art of Electronics," Second Edition, 1989, Cambridge, pp. 231-232. 2 pages.

IBM Corporation, "PowerPC Embedded Processors PowerPC 440GP-DDR SDRAM Controller Initialization," Mar. 20, 2002, pp. 1-7. 8 pages.

(56) References Cited

OTHER PUBLICATIONS

Integrated Device Technology, Inc., "CMOS Parallel-to-Serial FIFO 256x16, 512x16, 1024x16," pp. 1-10, Dec. 1999, available at http://www.digchip.com/datasheets/parts/datasheet/222/IDT72105.php. 10 pages.

International Preliminary Report on Patentability dated Jun. 8, 2010 re Int'l. Application No. PCT/US07/63780. 8 Pages.

Khatib, Jamil, "FIFO, First-In First-Out Memory," Mar. 28, 1999, available at http://www.geocities.com/Silicon Valley/Pines/6639/ip/fifo.html. 6 pages.

Muttersbach et al., "Practical Design of Globally-Asynchronous Locally-Synchronous Systems," Sixth International Symposium on Advanced Research in Asynchronous Circuits and Systems (ASYNC 2000). 8 pages.

PCT International Preliminary Report on Patentability and Written Opinion dated Mar. 1, 2007 in International Application No. PCT/US2005/028709. 13 pages.

PCT International Search Report and Written Opinion dated Dec. 5, 2007 in International Application No. PCT/US2007/063780. 14 pages.

Rajpal et al., "Designing with FIFOs," Technical Note TN-06, pp. 1-2, Integrated Device Technology, Inc., Nov. 1997, available at http://www.elektroniknet.de/fileadmin/userupload/IDT/TN-062020Designing20with20Async20FIFOs.pdf. 2 pages.

Ryan, Kevin, "DDR SDRAM Functionality and Controller Read Data Capture," Micron Technology, Inc., DesignLine, 1999, pp. 1-24, vol. 8, Issue 3. 24 pages.

Schumann et al., "An Asynchronous up/down Counter for Control of a Self-timed, Wave-pipelined Array Multiplier," Abstract, ACiD-WL Workshop, Groningen, the Netherlands, Sep. 1996, available at http://mikro.ee.tuberlin.de/forschung/sgemos/abstractACiD.ps.gz. 1 page.

Stott, Bret G., U.S. Appl. No. 13/301,383, filed Nov. 21, 2011, re Information Disclosure Statement dated Jan. 23, 2012. 7 pages.

Stott, Bret re U.S. Appl. No. 11/384,148, filed Mar. 16, 2006 re Response dated Oct. 22, 2010 to the Office Action dated Jun. 22, 2010. 16 pages.

Stott, Bret re U.S. Appl. No. 11/384,148, filed Mar. 16, 2006 re Final Office Action dated Aug. 12, 2011. 11 Pages.

Stott, Bret re U.S. Appl. No. 11/384,148, filed Mar. 16, 2006 re Response dated May 23, 2011 to the Office Action dated Jan. 21, 2011. 11 Pages.

Stott, Bret re U.S. Appl. No. 11/384,148, filed Mar. 16, 2006 re Response dated Mar. 11, 2010 to Office Action dated Dec. 11, 2009. 10 pages.

Stott, Bret re U.S. Appl. No. 11/384,148, filed Mar. 16, 2006 re Office Action dated Jan. 21, 2011. 11 Pages.

Stott, Bret re U.S. Appl. No. 11/384,148, filed Mar. 16, 2006 re Office Action dated Jun. 22, 2010. 11 pages.

Stott, Bret re U.S. Appl. No. 11/384,148, filed Mar. 16, 2006 re Response dated Sep. 28, 2011 to the Final Office Action dated Aug. 12, 2011. 8 Pages.

Stott, Bret, re U.S. Appl. No. 11/384,148, filed on Mar. 16, 2006 re Notice of Allowance and Fee(s) Due dated Oct. 14, 2011. 10 Pages.

Stott, Bret, U.S. Appl. No. 11/384,148, filed on Mar. 16, 2006 re Non-Final Office Action dated Dec. 11, 2009. 20 pages.

Texas Instruments Corporation, "SN74ALVC7804 512x18 First-In, First-Out Memory," SCAS432, pp. 1-10 & Addendum pp. 1-3, Jan. 1995, available at http://focus.ti.com/lit/ds/symlink/sn74alvc7804.pdf. 13 pages.

The International Bureau of WIPO, Geneva, Switzerland, "International Preliminary Report on Patentability," PCT/US2007/063780, Sep. 25, 2008, 7 pages.

Xilinx, "Using the XC9500 Timing Model," Application Note XAPP071, pp. 2-9 to 2-12, Xilinx Corporation, Jan. 1997, version 1.0, available at http://direct.xilinx.com/bvdocs/appnotes/xapp071.pdf. 4 pages.

* cited by examiner

SIGNALING SYSTEM WITH ADAPTIVE TIMING CALIBRATION

RELATED APPLICATIONS

This application is a Continuation of U.S. Ser. No. 15/250,685, filed Aug. 29, 2016, titled SIGNALING SYSTEM WITH ADAPTIVE TIMING CALIBRATION, which is a Continuation of U.S. Ser. No. 13/301,383, filed Nov. 21, 2011, titled SIGNALING SYSTEM WITH ADAPTIVE TIMING CALIBRATION, now U.S. Pat. No. 9,432,179, which is a Continuation of U.S. Ser. No. 11/384,148, filed Mar. 16, 2006, titled SIGNALING SYSTEM WITH ADAPTIVE TIMING CALIBRATION, now U.S. Pat. No. 8,121,237, all of which are incorporated herein by reference in their entirety.

FIELD OF THE INVENTION

The present invention relates to high-speed signaling systems.

BACKGROUND

Strobe signals are commonly used to control data transfer in high-speed signaling systems. In a typical arrangement, a transmitting device outputs a data signal onto a data line and simultaneously toggles a strobe signal on a corresponding strobe line to indicate the data transfer. The data and strobe signals propagate together to a recipient device which samples the data signal in response to the strobe signal transition.

For reliable operation, the data and strobe signals should arrive at the recipient device in a relatively precise phase relationship so that strobe-responsive sampling will occur at the desired sampling instant. Phase error between the data and strobe signals resulting from propagation-time differences on the strobe and data lines or from operational variations in the strobe and data signal drivers or receivers may cause the data signal to be sampled at a non-optimal point, reducing signaling margin and increasing the likelihood of bit errors.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION

A signaling system that adaptively compensates for phase errors between data signals and corresponding sample-timing signals is disclosed in various embodiments. In one embodiment, an incoming timing signal is passed through a variable delay circuit to provide a sampling signal that is used, in turn, to oversample an incoming data signal and thereby obtain phase error information. The phase error information is applied to iteratively adjust the propagation delay through the variable delay circuit and thus to adaptively compensate for phase errors between the timing signal and data signal, including static phase errors that result from signal propagation-time differences and operational variations between signal drivers and receivers and dynamic phase errors that result from gradual changes in voltage and temperature or other sources of run-time phase drift.

Figure 1A:
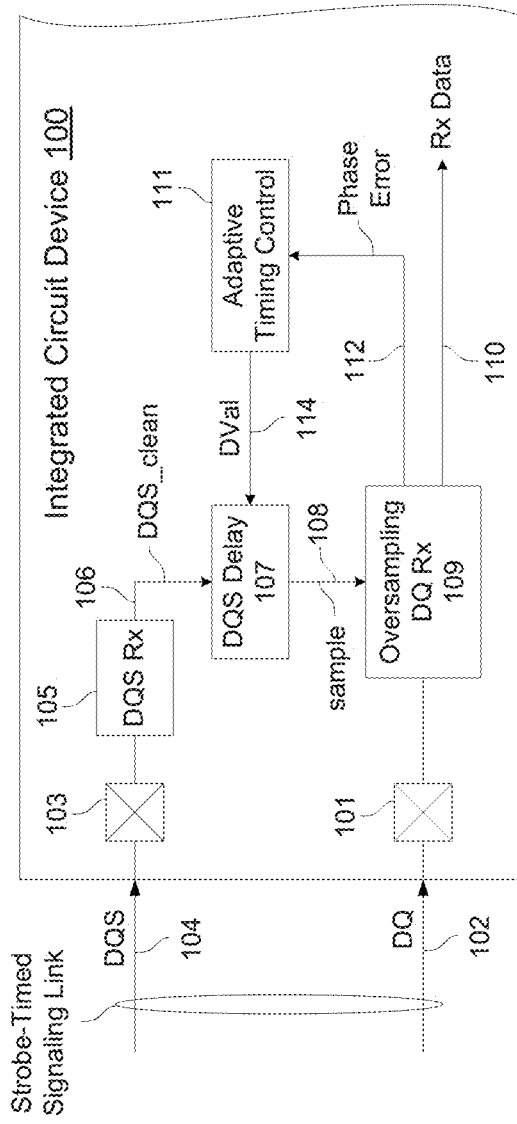
FIG. 1A illustrates an embodiment of an integrated circuit device having circuitry to adaptively compensate for static and dynamic phase errors between an incoming timing signal and a desired sampling instant in a corresponding data signal.

FIG. 1A illustrates an embodiment of an integrated circuit (IC) device 100 having circuitry to adaptively compensate for static and dynamic phase errors between an incoming timing signal 104 and a desired sampling instant in a corresponding data signal 102. In the embodiment of FIG. 1A and in other exemplary embodiments described herein, the incoming timing signal is a strobe signal, meaning an aperiodic timing signal that is toggled between upper and lower signaling levels to signal the presence of valid data on one or more associated data lines. In alternative embodiments, including each of the embodiments described herein, the incoming timing signal may be a clock signal instead of a strobe signal. Also, unless context indicates otherwise, the expression data is used generically herein to refer to masking information, command or request values, configuration information, error-checking and/or correcting information or any other type of information to be communicated over a signaling link.

In the embodiment of FIG. 1A, IC 100 includes input nodes 101 and 103, strobe receiver 105 (DQS Rx), strobe delay circuit 107 (DQS Delay), oversampling data receiver 109 (Oversampling DQ Rx) and adaptive timing control circuit 111 (Adaptive Timing Control). The input nodes 101 and 103 of the IC device 100 are provided to receive the data signal (DQ) and strobe signal (DQS) via respective data and strobe lines (102, 104) that collectively form a strobe-timed signaling link. Though depicted as contact pads, the input nodes 101, 103 may be any type of structure for receiving an incoming signal including, without limitation, contactless interconnects for receiving inductively or capacitively conveyed input signals.

Figure 1B:
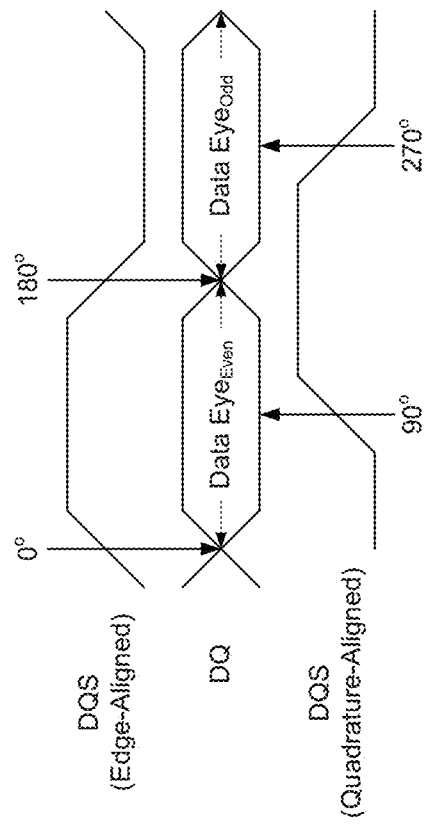
FIG. 1B illustrates an exemplary phase relationship between the strobe signal and data signal described in reference to FIG. 1A.

The nominal phase alignment between the incoming strobe and data signals may vary depending on the signaling protocol and the role of the IC device 100 within the signaling system. In a number of embodiments described herein, for example, the strobe signal may arrive at the IC device 100 in either edge-alignment or quadrature-alignment with data eyes in the incoming data signal (i.e., data-valid intervals) as shown in FIG. 1B. Furthering the example, the IC device 100 is assumed to be part of a double data rate signaling system in which data is transmitted during both even and odd phases of a transmit clock cycle (e.g., an even phase of the transmit clock cycle may be referenced to a rising edge transition of a transmit clock signal, and an odd phase of the transmit clock cycle may be referenced to a falling edge of the transmit clock signal), thus delivering two data values, even and odd, to the IC device 100 per transmit clock cycle. Selecting the transmit clock cycle time as a reference period and the opening edge of the even data eye as a 0° point, then edge-aligned strobe signal transitions occur nominally at 0 and 180° as shown in FIG. 1B, while quadrature-aligned strobe signal transitions occur nominally at 90 and 270°, at the midpoints of the data eyes. Double data rate signaling and data-edge-referenced phase notation is assumed in a number of the embodiments described below, though any other data rates may be used in alternative embodiments (e.g., the number of data values per transmit clock cycle may be 1, 4, 8, 10, 16 or any other desirable value) and phase angles may be referenced to any useful reference point. Also, in IC device 100 and other embodiments described below, the ideal sampling instant is assumed for simplicity to occur at the midpoint of each data eye (i.e., at quadrature alignment to edges of the data eye), though the ideal sampling instant may be offset from the date eye midpoint in various embodiments to account for differences between receiver setup and hold times or where maximum eye-opening is offset from the midpoint.

Still referring to FIG. 1A, in systems in which the strobe line 104 is shared by two or more devices (e.g., where IC device 100 both receives and transmits strobe signals on the strobe line 104 as in a bidirectional signaling arrangement), the strobe line 104 may be driven to a predetermined level at the conclusion of a given transmission, thereby relinquishing the strobe line 104 for use by one or more other devices. Such operation is referred to herein as parking the strobe line and, in one embodiment, involves charging the strobe line 104 (or enabling the strobe line to be charged) to a midpoint level so that an initial transition from the midpoint level to an upper or lower signal level will not trigger a data sampling operation in the recipient device, but rather acts as a start-of-transfer signal to indicate that one or more data-sampling transitions of the strobe signal are forthcoming. Accordingly, when applied in such an embodiment, the strobe receiver 105 may include circuitry to detect start-of-transfer indications and, in response, pass subsequent strobe signal transitions to downstream circuitry in the form of a clean strobe signal 106 (DQS_clean). In applications that do not require strobe line parking (e.g., strobe line 104 is not driven by more than one device), the strobe receiver 105 may be implemented, for example, by a simple buffer amplifier or omitted altogether.

In one embodiment, the strobe delay circuit 107 is a variable-delay circuit having a propagation delay selected from a range of propagation delays in accordance with a delay control value 114 (DVal). Thus, the strobe delay circuit delays the clean strobe signal according to the delay control value to yield a clean, delayed strobe signal referred to herein as a sampling signal 108 (sample). In one embodiment, the strobe delay circuit is implemented by a variable delay line that exhibits a range of propagation delays centered around a nominal data sampling instant. For example, in an embodiment in which an edge-aligned strobe signal is received, the propagation delay range may center around 360°/2n, where 'n' is the data rate, thus placing the sampling signal 108 at the nominal midpoint of data eyes in the incoming data signal. Thus, in the case of an edge-aligned strobe signal in a double data rate signaling system as shown in FIG. 1B, the propagation delay range may be centered around 90° to place the sampling signal 108 nominally at the desired sampling point. In the case of a quadrature-aligned strobe signal 104, the incoming strobe signal is already nominally aligned with the data eye midpoint. In such cases, a small delay, a, may be introduced in the data signal path either in the transmit device or in IC 100 (or both) to enable the nominal propagation delay of the strobe delay circuit 105 to be centered around a, thus providing headroom for advancing the propagation delay of the strobe signal 104 relative to the data signal 102. The range of propagation delays may be selected according to a maximum expected phase error in the incoming strobe signal, or to allow a full range of correction, or correction up to ±360°/2n, where n is the data rate.

The oversampling data receiver 109 samples the incoming data signal 102 in response to the sampling signal 108 to generate a sequence of data samples 110, and additionally samples the incoming data signal 102 in response to a phase-shifted version of the sampling signal that is nominally edge-aligned with the data signal thereby providing a sequence of edge samples. Accordingly, the data signal 102 is said to be oversampled, meaning sampled more frequently than the rate at which symbols are conveyed in the signal. In this example in which every other data edge is sampled, the oversampling ratio (i.e., ratio of samples captured to symbols received) is 3:2. That is, two data samples and an edge sample are captured for each pair of received data bits. In a mode in which each data edge is sampled, the oversampling ratio would be 2:1.

In the exemplary double-data rate timing arrangement shown in FIG. 1B, the phase offset between the sampling signal 108 and phase-shifted version of the sampling signal is the quadrature offset, 90°. Accordingly, the phase-shifted version of the sampling signal is referred to herein as a quadrature sampling signal to indicate the data-eye edge-to-midpoint phase offset relative to the sampling signal, but the phase offset may be smaller or greater than 90°, for example, where different data rates apply and may be a programmably selected value to support multiple data rates.

In one embodiment, the oversampling data receiver 109 compares the data and edge samples over time to develop a phase error 112 that indicates whether the edge samples are predominantly captured after or before corresponding transitions of the data signal and thus indicates whether the sampling signal is early or late relative to a desired sampling instant (i.e., the data eye midpoint in this example). The phase error 112 is supplied to the adaptive timing control circuit 111 which adjusts the delay control value 114 in accordance with the phase error 112, thereby decreasing or increasing the propagation delay in the strobe delay circuit 107 to adjust the phase of the sampling signal 108 in a direction that counters the phase error 112. Thus, by oversampling the incoming data signal 102 to obtain phase error information and applying the phase error information to carry out closed-loop phase adjustment, the propagation delay experienced by the incoming strobe signal 104 may be adaptively adjusted to maintain the desired data sampling instant despite run-time changes in voltage and temperature or other sources of phase drift. Moreover, because of the error-correcting nature of the phase adjustment loop (i.e., negative feedback operation), static or systematic phase errors that result from chip-to-chip propagation-time differences between strobe and data signals or from signaling component variations (e.g., drive-strength variations in signal drivers, variation between signal line termination components, variations in signal receiver operation, etc.) may be automatically compensated by the continuous adaptive calibration, obviating specialized initialization-time calibration circuitry and procedures.

Still referring to FIG. 1, it should be noted that instead of delaying the strobe signal 104 (or clean version thereof) in strobe delay circuit 107, the incoming data signal 102 may be delayed in a data delay circuit (not shown) to achieve a desired sample timing relationship. Thus, the delay control value may be supplied to the data delay and applied therein to adjust the phase of the sampled data signal in a direction that counters the phase error 112.

Figure 2:
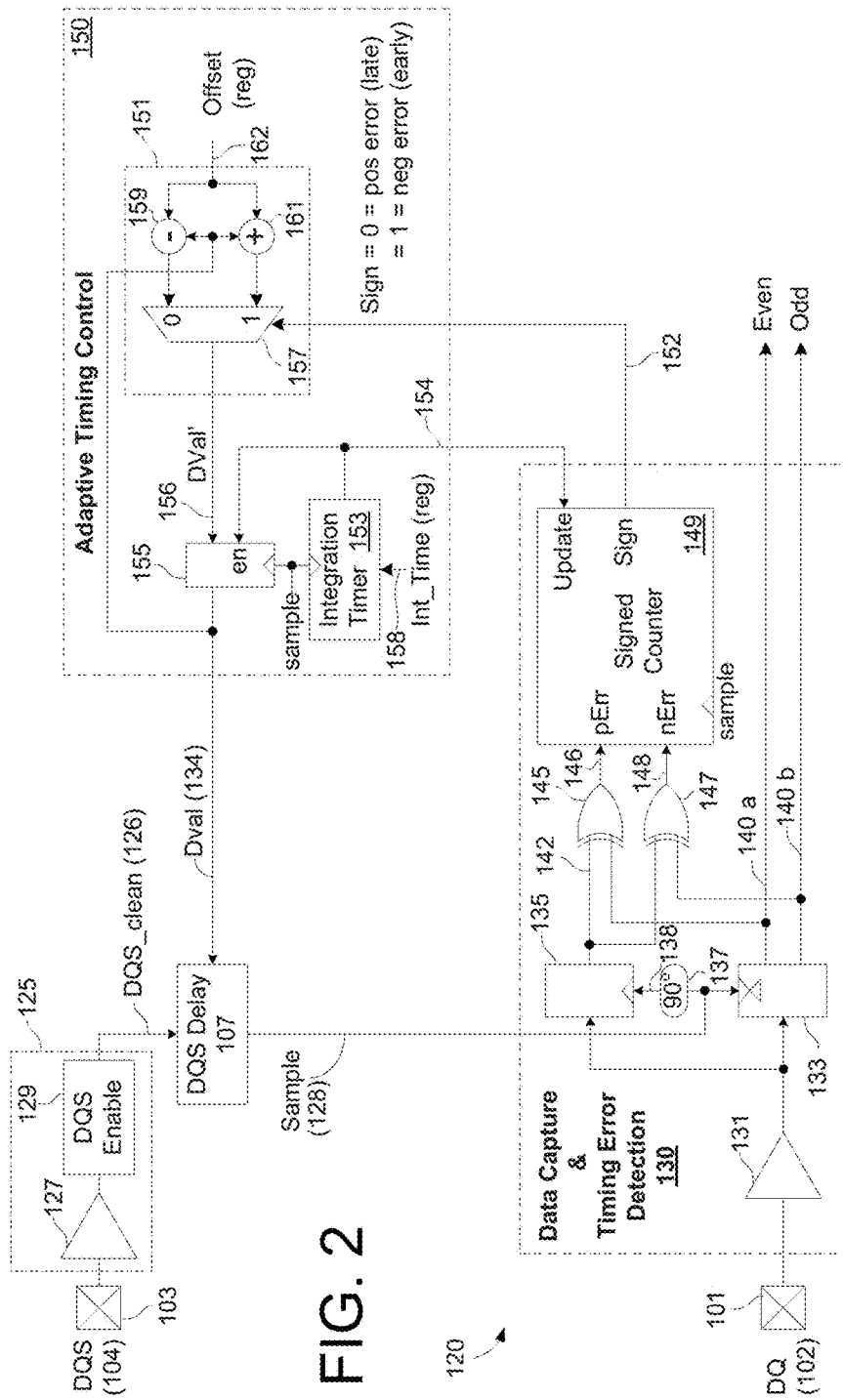
FIG. 2 illustrates a more detailed embodiment of an integrated circuit device having adaptive timing calibration circuitry.

FIG. 2 illustrates a more detailed embodiment of an IC device 120 having adaptive timing calibration circuitry. IC device 120 includes input nodes 101 and 103 for receiving data and strobe signals 102 and 104 (DQ and DQS), together with a strobe receiver 125, strobe delay circuit 107, oversampling data receiver 130, and adaptive timing control circuit 150. The strobe receiver 125 includes a buffer amplifier 127 and strobe enable logic 129 to convert a three-level strobe signal (i.e., having high, low and parked signal levels) into a binary, clean strobe signal 126 (DQS_clean), and the strobe delay circuit 107 operates generally as described in reference to FIG. 1 to delay the clean strobe signal 126 in accordance with a delay control value 134 (DVal) to produce sampling signal 128. The sampling signal 128 is provided, in turn, to the oversampling receiver 130 where it is used to trigger sampling of the incoming data signal. The oversampling receiver 130 is designated "Data Capture & Timing Error Detection" in FIG. 2 to emphasize its dual data capture and timing error detection roles.

The oversampling receiver 130 includes a buffer amplifier 131 to amplify the incoming data signal 102 and to supply the amplified signal to data and edge sampling circuits 133 and 135. The data sampling circuit 133 samples the incoming data signal in response to positive and negative edges of the sampling signal 128 (or, if the sampling signal 128 is generated differentially, in response to rising edges of complementary components of the sampling signal) and thus generates (i.e., captures, latches, registers, etc.) a sequence of even and odd data samples, 140a and 140b. The even and odd data samples are also referred to herein as leading and lagging samples to indicate their arrival sequence at the IC device, and as positive and negative data samples to emphasize the sampling signal transitions that trigger their capture. The edge sampling circuit 135 samples the incoming data signal in response to a quadrature sampling signal 138, a version of the sampling signal 128 that is phase shifted by delay element 137 (shown in this example as a 90° delay element, but more generally implemented by a 360°/2n delay element, where n is the data rate) to establish a sampling point nominally aligned with transitions in the incoming data signal, and thus generates a sequence of edge samples 142 that correspond to the sequence of data samples 140a, 140b (collectively, 140) generated by data sampling circuit 133.

Figure 3B:
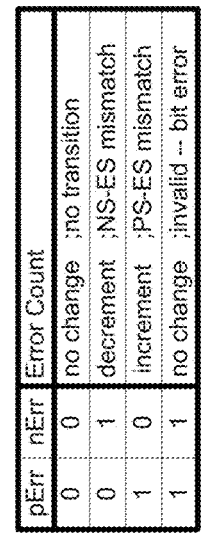
FIG. 3B illustrates exemplary error counting operations that result from comparisons of the edge sample and data sample pair of FIG. 3A.
Figure 3A:
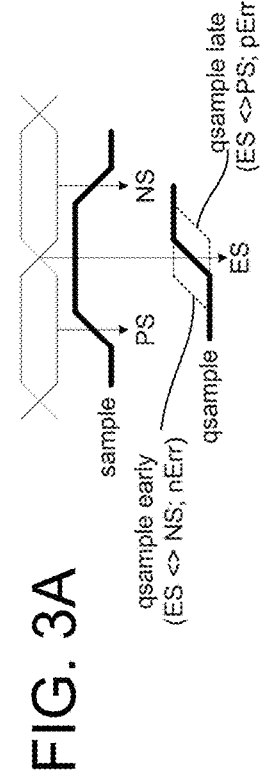
FIG. 3A illustrates an exemplary positive and negative data sample pair and intervening edge sample that collectively form a phase-error indicator.

Referring to FIG. 3A, each positive and negative data sample pair and intervening edge sample collectively form a phase-error indicator referred to herein as a tri-sample. That is, if a data transition has occurred (i.e., positive sample (PS) not equal to negative sample (NS)), then the edge sample (ES) will match the positive sample if the quadrature sampling signal transitions early relative to data signal transition and will match the negative sample if the phase-shifted sampling signal transitions late relative to the data signal transition. Accordingly, referring to FIGS. 2 and 3A, if the edge sample and positive sample do not match (ES< >PS), the quadrature sampling signal 138 and therefore the sampling signal 128 are deemed to be late relative to their desired sampling times and a positive error 146 (i.e., positive-sample mismatch, pErr) is signaled by exclusive-OR gate 145 to indicate the late condition. If the edge sample and negative sample do not match (ES< >NS), the quadrature sampling signal 138 and sampling signal 128 are deemed to be early relative to their desired sampling times, and a negative error, nErr, is signaled by exclusive OR gate 147 to indicate the early condition. Note that, in the embodiment of FIG. 2 and any other embodiments described herein, falling edges of the quadrature sampling signal may also be used to sample the incoming data signal at the transition between odd and even data eyes, and thus doubling the edge sampling rate and, accordingly, the rate at which phase error information is gathered.

In the embodiment of FIG. 2, a signed counter 149, referred to herein as a phase error counter or error counter, is provided to adjust an error count at each rising edge of the sampling signal 128 according to the phase error indicated by exclusive-OR gates 145 and 147 (collectively referred to herein as error logic gates) in response to the tri-sample captured at the preceding rising and falling edges of the sampling signal 128 and at the rising edge of the quadrature sampling signal 138. Referring to FIG. 3B, for example, if a negative error is signaled (nErr=1, pErr=0), the error count is decremented and if a positive error is signaled (pErr=1, nErr=0), the error count is incremented. By this operation, the error count constitutes a differential error value that indicates the difference between the number of positive and negative errors detected over a given time interval. The sign of the error count indicates whether the majority of errors are positive or negative (i.e., sampling late or early) and the magnitude of the error count indicates the magnitude of the phase error. Still referring to FIG. 3B, the error count remains unchanged if no phase error is signaled (nErr=pErr=0) or if both phase errors are signaled (nErr=pErr=1), the final case being an invalid condition in which a bit error may be inferred. Additional logic, not shown, may be provided to track bit errors indicated by the error logic gates and to and take corrective action (e.g., if a threshold number of bit errors are detected per unit time), or notify the transmitting device of the error status. In one embodiment, for example, the IC device 120 may negotiate a reduced signaling rate with the transmitting IC in response to detecting a threshold number of bit errors within a given time interval. Alternatively or additionally, the IC device 120 may adjust signal reception parameters (or request the transmitting IC to adjust signal transmission parameters) including, for example and without limitation, equalization parameters, decision threshold levels used to distinguish logic '1' and logic '0' signal levels within the sampling circuits 133 and 135 (or either one of them) or any other parameters that may be adjusted to reduce the bit error rate.

Still referring to FIG. 2, the adaptive timing controller 150 includes an integration timer 153 that counts sampling signal assertions and raises (or lowers) an update signal 154 upon reaching a threshold count value, thus establishing a minimum phase error detection interval referred to herein as an integration period. In one embodiment, the integration timer 153 receives an integration time value 158 (i.e., specifying a threshold count value) from a one-time or run-time programmable register within IC 120 (not shown), thus allowing the integration period to be programmed in accordance with system needs. The integration period may alternatively be fixed. In either case, the update signal 154 is supplied to the error counter 149 to mark the transition between integration periods. In one embodiment, the error counter 149 responds to assertion of the update signal 154 by latching (or registering) the sign of the error count at a sign output (Sign) to provide an error sign signal 152 and by resetting the error count (e.g., to zero) in preparation for the ensuing integration period. Thus, the error sign 152 generated during a given integration period is maintained at the sign output of the error counter 149 during the subsequent error integration period, thereby enabling pipelined operation in which the error sign 152 for a given integration period, n, is applied to update the delay control value 134 while an error sign for subsequent integration period, n+1, is developed within the error counter 149.

The error sign 152 is supplied to a delay value update circuit 151 within the adaptive timing control circuit to generate an updated delay control value 156 (DVal'). In the embodiment of FIG. 2, for example, the error sign 152 is supplied to a control input of multiplexer 157 to select an incremented or decremented version of the applied delay control value 134 to be the updated delay control value 156. That is, if the error sign 152 indicates that a majority of the phase errors detected in the preceding integration period are positive phase errors (e.g., error sign=0), then the sampling signal 128 is deemed to be late relative to the desired data sampling point so that a decremented delay control value is selected as the updated delay control value 156 to reduce the propagation delay through the strobe delay circuit 107 and thus advance the sampling signal 128 toward the desired sampling point. Conversely, if the error sign 152 indicates that a majority of the phase errors detected in the preceding integration period are negative phase errors (e.g., error sign=1), then the sampling signal 128 is deemed to be early relative to the desired sampling point and an incremented delay control value is selected as the updated delay control value 156 to increase the propagation delay through the strobe delay circuit 107 and thus retard (i.e., delay) the sampling signal 128 relative to the desired sampling point. In the particular embodiment shown, a delay control storage element 155 (e.g., a register or latch) is provided to store the applied delay control value 134 (i.e., delay control value, DVal, supplied to the strobe delay circuit 107 during a given integration period). As shown, the applied delay control value 134 is also supplied to arithmetic operators 159 and 161 (e.g., a subtraction or decrementing circuit and an addition or incrementing circuit, respectively) within the delay value update circuit 151. The arithmetic operators 159 and 161 are coupled to receive an offset value 162 from a programmable register and perform an offset subtraction and offset addition, respectively, to generate the decremented and incremented delay control values supplied to inputs of multiplexer 157. In alternative embodiments, the offset value 162 may be fixed. Also, the offset value 162 may be selected, automatically or in response to a programmed selection value, from among multiple fixed or programmable offsets to enable different granularity in the phase error correction to be selected (e.g., coarse granularity selected initially, finer granularity selected thereafter). Further, separate offset values may be provided to the arithmetic operators 159 and 161. In any case, the update signal 154 is supplied to an enable-input ("en") of delay control storage element 155 so that, when the update signal 154 is asserted, the updated delay control value 156 selected by multiplexer 157 is loaded into delay control storage element 155, thereby establishing a new delay control value 134 to adjust the propagation delay in the strobe delay circuit 107.

Figure 4:
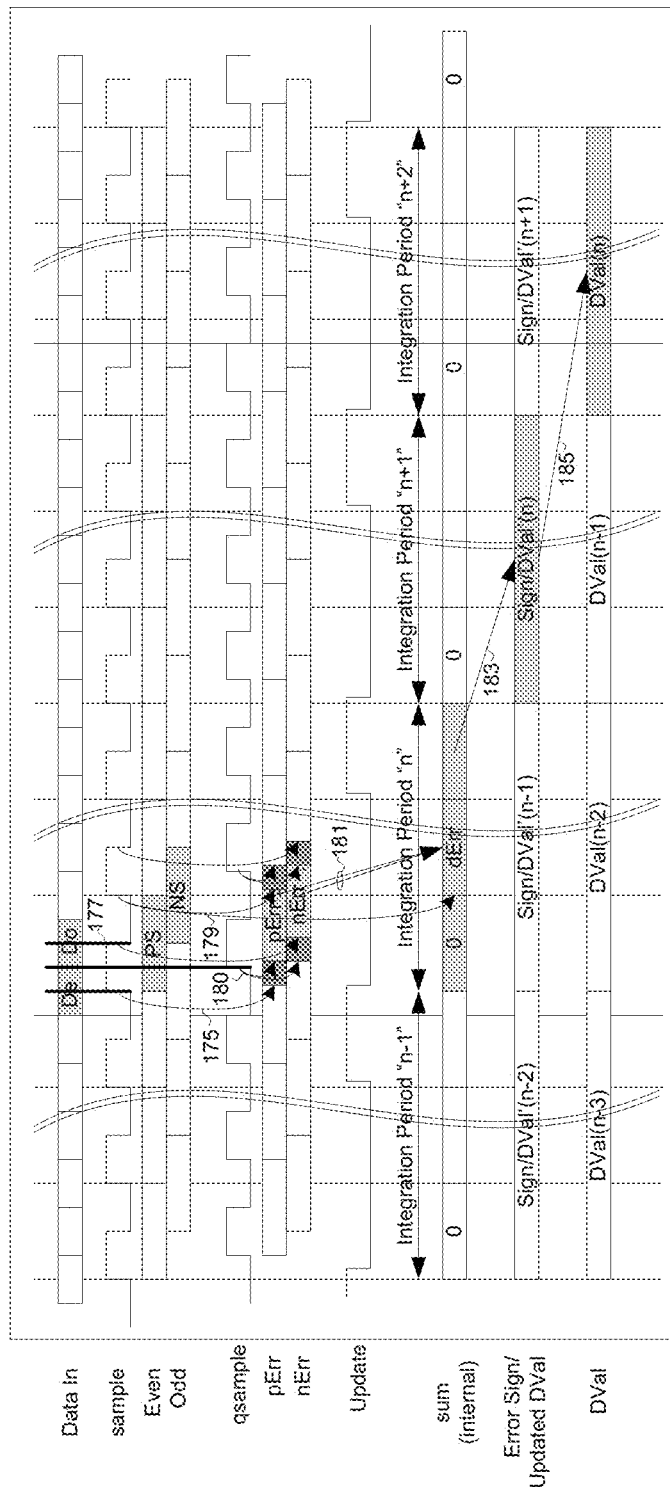
FIG. 4 is an exemplary timing diagram for the adaptive timing calibration circuitry of FIG. 2.

FIG. 4 is an exemplary timing diagram for the adaptive timing calibration circuitry of FIG. 2. As shown, an input data signal (Data In) includes even and odd data eyes, De and Do, in successive transmission intervals. Even data eye, De, is sampled in response to a rising edge 175 of the sampling signal (sample) to provide even data sample, PS (i.e., positive sample), and odd data eye, Do, is sampled in response to the subsequent falling edge 177 of the sampling signal to provide odd data sample, NS (negative sample). The transition between the even and odd data eyes is sampled in response to rising edge 180 of the quadrature sampling signal (qsample) to provide an edge sample, ES, that, when combined with the even and odd data samples, completes a tri-sample for the current sampling cycle. As discussed above, the edge sample and even sample are compared to generate positive error signal, pErr, and the edge sample and odd sample are compared to generate negative error signal, nErr. At the rising sampling signal edge 179 immediately following capture of the tri-sample, the phase error indicated by the positive and negative error signals is integrated (i.e., accumulated) into the error sum, Esum, for integration period "n"; an operation indicated at 181. Thereafter, at the conclusion of integration period n, the sign of the error count is latched (or registered) and applied during subsequent integration period n+1, as shown at 183, to generate an updated delay control value, DVal'(n). As shown at 185, at the start of integration period n+2, the updated delay control value is latched (or registered) as the delay control value, DVal, applied during that period to control the propagation delay of the strobe delay circuit.

Referring to FIGS. 2 and 4, it can be seen that the applied delay control value 134 for a given integration period, n, corresponds to the error sign generated during integration period n−2, and thus is applied two integration periods after the corresponding phase errors were detected. This loop latency results, in part, from the latent error sign output from the error counter and also due to latent selection of the updated delay control value in response the error sign. Loop latency may be reduced in alternative embodiments, for example, by applying the error sign generated during given integration period at the conclusion of that interval to deliver an updated delay control value to the strobe delay circuit.

Figure 5:
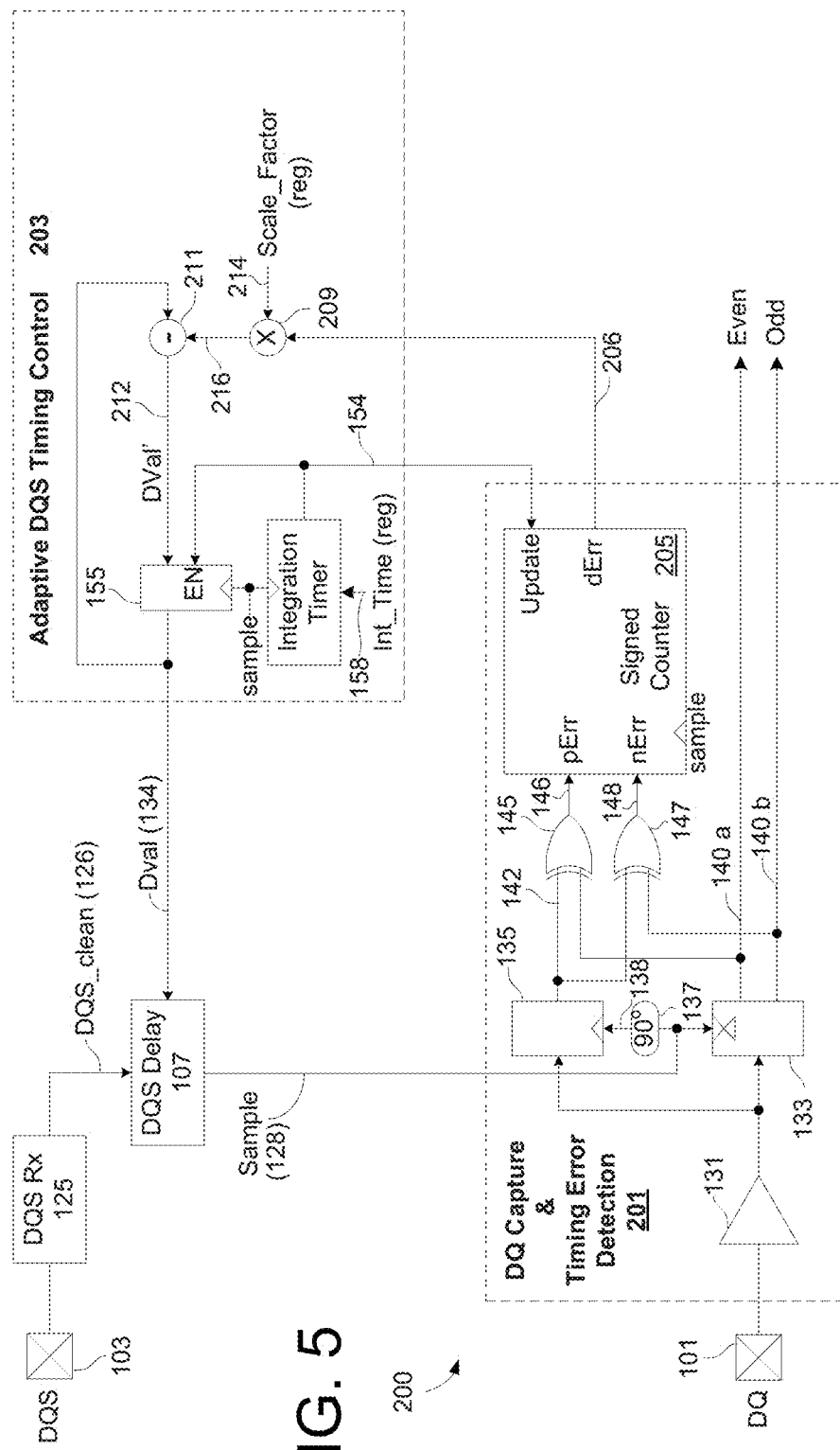
FIG. 5 illustrates an embodiment of an integrated circuit device having adaptive timing calibration circuitry similar to that of FIG. 2, except that propagation delay adjustments are made in proportion to the magnitude of the phase error detected in a given integration period, rather than incrementally.

FIG. 5 illustrates an embodiment of an IC device 200 having adaptive timing calibration circuitry similar to that of FIG. 2, except that propagation delay adjustments are made in proportion to the magnitude of the phase error detected in a given integration period, rather than incrementally. Thus, the strobe receiver 125, strobe delay circuit 107, data signal amplifier 131, data and edge sampling circuits 133 and 135, quadrature delay element 137, error logic gates 145 and 147, integration timer 153, and delay control storage element 155 all operate generally as described in reference to FIG. 2. Error counter 205 also operates similarly to the error counter 149 described in reference to FIG. 2, but, instead of outputting only the sign of the differential error value (i.e., error count) developed over a given integration period, error counter 205 outputs the entire differential error value 206 (dErr), for example, as a signed numeric value. In the particular embodiment shown, the differential error value 206 generated within data capture and timing error detection circuit 201 is supplied to a multiplier circuit 209 within adaptive timing control circuit 203 which multiplies the differential error value 206 by a programmable scale factor 214 to generate a phase correction value 216. The phase correction value 216 is supplied, in turn, to arithmetic circuit 211 which subtracts the phase correction value 216 from the applied delay control value 134 (DVal) to generate updated delay control value 212 (DVal'). By this operation, a negative differential error value 206, indicating that transitions of quadrature sampling signal 138 are predominantly early relative to corresponding data transitions, will yield an increased updated delay control value 212 to delay the sampling signal 128 and quadrature sampling signal 138. Conversely, a positive differential error value 206, indicating that sampling signals are predominantly late, will yield a decreased delay control value to advance the sampling signal. In general the timing diagram of FIG. 4 applies equally to operation of IC 200. As discussed, latency between phase error determination and corresponding adjustment of the delay control value 134 may be reduced in alternative embodiments, and the incoming data signal may additionally be sampled at the transition between odd and even data eyes to more rapidly gather phase error information.

Figure 6:
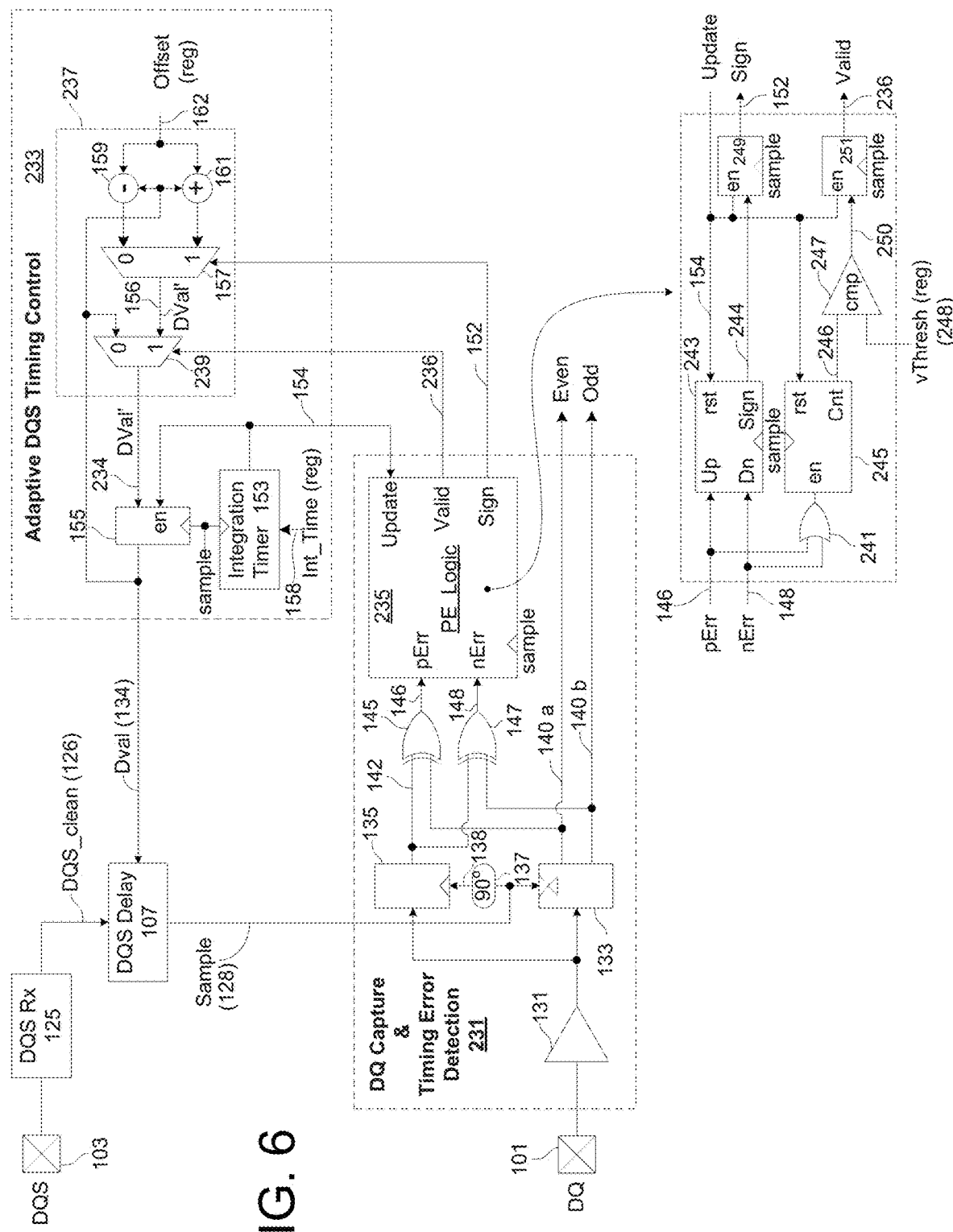
FIG. 6 illustrates an embodiment of an integrated circuit device having adaptive timing calibration circuitry similar to that of FIG. 2, but including additional logic to ensure that a threshold number of phase error indications are obtained before adjusting the applied delay control value.

FIG. 6 illustrates an embodiment of an IC device 230 having adaptive timing calibration circuitry similar to that of FIG. 2, but including additional logic to ensure that a threshold number of phase error indications are obtained before adjusting applied delay control value 134. Thus, the strobe receiver 125, strobe delay circuit 107, amplifier 131, data and edge sampling circuits 133 and 135, quadrature delay element 137, error logic gates 145 and 147, integration timer 153, and delay control storage element 155 operate generally as described in reference to FIG. 2. Phase error logic 235 (i.e., PE Logic, part of data capture and timing error detection circuit 231) also operates similarly to the error counter 149 described in reference to FIG. 2, but includes additional circuitry to compare the total number of phase error indications generated during a given integration period (i.e., total number of pErr and nErr assertions) with a fixed or programmable threshold and to generate, according to the comparison result, a valid signal 236 which qualifies or disqualifies the corresponding error sign 152. Thus, if the valid signal 236 is true (logic '1' in this example), the error sign 152 is qualified as the result of a sufficient number of phase error indications and multiplexer 239 within adaptive timing control circuit 233, which receives the valid signal 236 at a control input, passes an updated delay control value 156 to the input of the delay control storage element 155 as the delay control value 234 to be applied during the next integration period. Conversely, if the valid signal 236 is false (logic '0' in this example), the multiplexer 239 passes the applied delay control value 134 back to the input of the delay control storage element 155 to effect a hold state therein and thus prevent the disqualified error sign 152 from being used to adjust the applied delay control value 134.

In one embodiment, shown in detail view 240, the phase error logic 235 includes an up/down counter 243 that operates as described in reference to FIG. 2 to generate a differential error count, as well as a monotonic counter 245 (i.e., up-only or down-only counter) to count the total number of phase error indications. In the particular embodiment shown, the positive and negative phase error signals (pErr and nErr) are supplied to an OR gate 241 having an output coupled to the count-enable input of the monotonic counter 245. By this arrangement, when a positive or negative phase error is signaled (i.e., in signals 146 or 148), the output of the OR gate 241 goes high to enable an aggregate phase error count 246 within the monotonic counter 245 to be incremented at the next assertion of the sampling signal 128. The aggregate phase error count 246 is supplied to comparator 247 where it is compared with a fixed or programmable threshold value 248 to generate a qualifier bit 250. The update signal is supplied to enable inputs (en) of storage elements 249 and 251 (e.g., latches or registers) and to the reset (rst) inputs of the counters 243 and 245 so that, when the update signal 154 is asserted, the error sign bit 244 and corresponding qualifier bit 250 are captured in the storage elements 249 and 251 at the next assertion of the sampling signal 128, and the count values within counters 243 and 245 are cleared in preparation for the subsequent integration period. The error sign bit and qualifier bit are output from the storage elements 249 and 250 as the sign bit 152 and valid bit 236, respectively.

In an alternative embodiment, the phase error logic 235 may include separate monotonic counters (e.g., to count only up or down) to count the early indications and the late indications, respectively, signaled by the error values 146 and 148, with logic to output a high or low error sign bit according to which of the monotonic counters develops a higher count during a given integration period and to generate a high or low valid bit according to whether a sum of the counts of the monotonic counters exceed a fixed or programmed threshold value.

Figure 7:
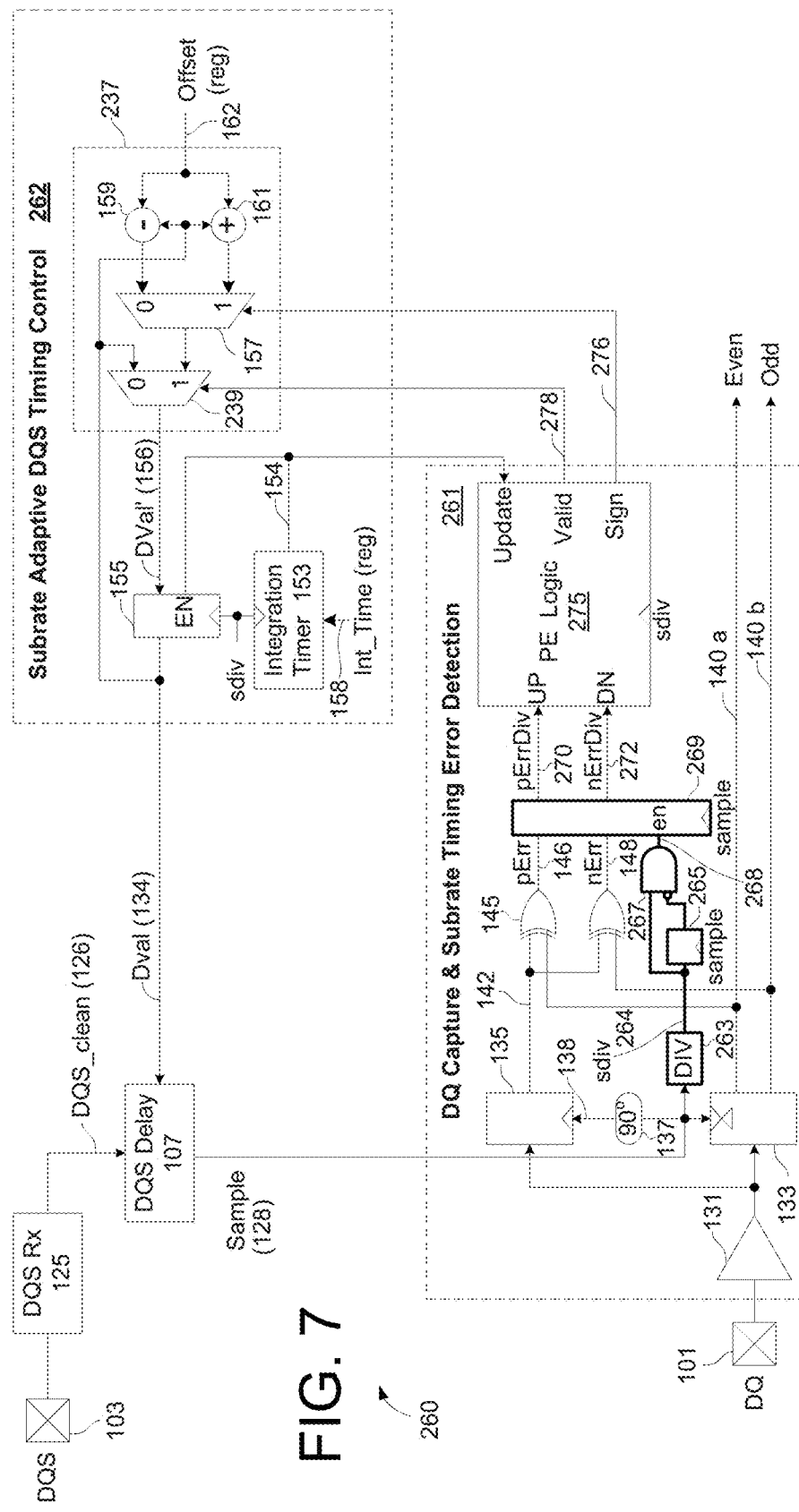
FIG. 7 illustrates an embodiment of an integrated circuit device having adaptive timing calibration circuitry similar to that of FIG. 2, but with subrate loop operation.

FIG. 7 illustrates an embodiment of an IC device 260 having adaptive timing calibration circuitry similar to that of FIG. 2, but with subrate loop operation. More specifically, rather than processing phase errors at the rate of the sampling signal 128 (and thus at the peak data transfer rate of the signaling system), a frequency-divided version of the sampling signal, referred to herein as a subrate sampling signal, is used to time operation of phase error logic 275 and adaptive timing control circuitry 262, thus reducing the rate at which phase error information is gathered and applied to update the sampling signal phase in exchange for reduced loop power consumption and relaxed logic timing.

As shown, IC device 260 includes a strobe signal receiver 125; a strobe delay circuit 107; an oversampling receiver 261 that includes amplifier 131, data and edge sampling circuits 133 and 135, error logic gates 145 and 147, and phase error logic 235; and an adaptive timing control circuit 262 that includes integration timer 153, delay control storage element 155, and delay control update circuit 237 (having multiplexers 157 and 239, and arithmetic operators 159 and 161); all of which operate generally as described above in reference to FIGS. 2 and 6 to effect an adaptive timing calibration loop. In addition to the aforementioned components, the oversampling receiver 261 includes a divider circuit 263 to divide the sampling signal 128 by a subrate factor, N, and thus generate a subrate sampling signal 264 (sdiv). In the particular embodiment shown, the subrate sampling signal 264 is supplied to a pulse generator formed by edge-triggered storage element 265 (e.g., a flip-flop) and logic AND gate 267, and to the timing inputs of the phase error logic 275, integration timer 153 and delay control storage element. The pulse generator operates to generate a subrate pulse 268 every N cycles of the sampling signal 128. More specifically, the sampling signal 128 is supplied to a triggering input of storage element 265 while the subrate sampling signal 264 is provided to a data-in node of storage element 265 and to a non-inverting input of AND gate so that, when the subrate sampling signal 264 goes high, the logic low output of storage element 265 (which is supplied to an inverting input of AND gate 267), will cause the output of AND gate 267 to go high until the high state of the subrate sampling signal 264 is captured in the storage element at the next rising edge of the sampling signal. Thus, the subrate pulse 268 is initially low when the sampling signal 128 goes high at the start of a tri-sample capture sequence, but goes high during capture of the tri-sample and remains high until the next rising edge of the sampling signal 128 (i.e., start of a subsequent tri-sample capture sequence). At that point, the subrate pulse 268 goes low and remains low during the capture of N−1 tri-samples, before going high again to during capture of another tri-sample. Thus, the subrate pulse 268 goes high for one of every N cycles of the sampling signal 128. Accordingly, by providing the subrate pulse 268 to the enable input (en) of an error storage element 269 that is triggered by the sampling signal 128, the error storage element 269 is enabled to store the positive and negative phase error signals 146 and 148 (i.e., pErr and nErr), generated by error logic gates 145 and 147 as described above, once every N cycles of the sampling signal 128 (i.e., once for every N tri-samples) and thus outputs positive and negative subrate phase error signals 270 and 272 (pErrDiv and nErrDiv). The subrate phase error signals 270 and 272 are applied within the phase error logic 235 generally as described in reference to FIG. 6 to generate an error sign 276 and valid signal 278 at the subdivided loop rate. That, the phase error logic may be implemented as described in reference to FIG. 6, but receives subrate phase error signals 270 and 272 in place of the sampling rate phase error signals (146 and 148 in FIG. 6) and is clocked by the subrate sampling signal instead of the sampling signal. The adaptive timing control circuit 262 similarly operates as described in reference to FIG. 6, but at the reduced loop rate.

Figure 8:
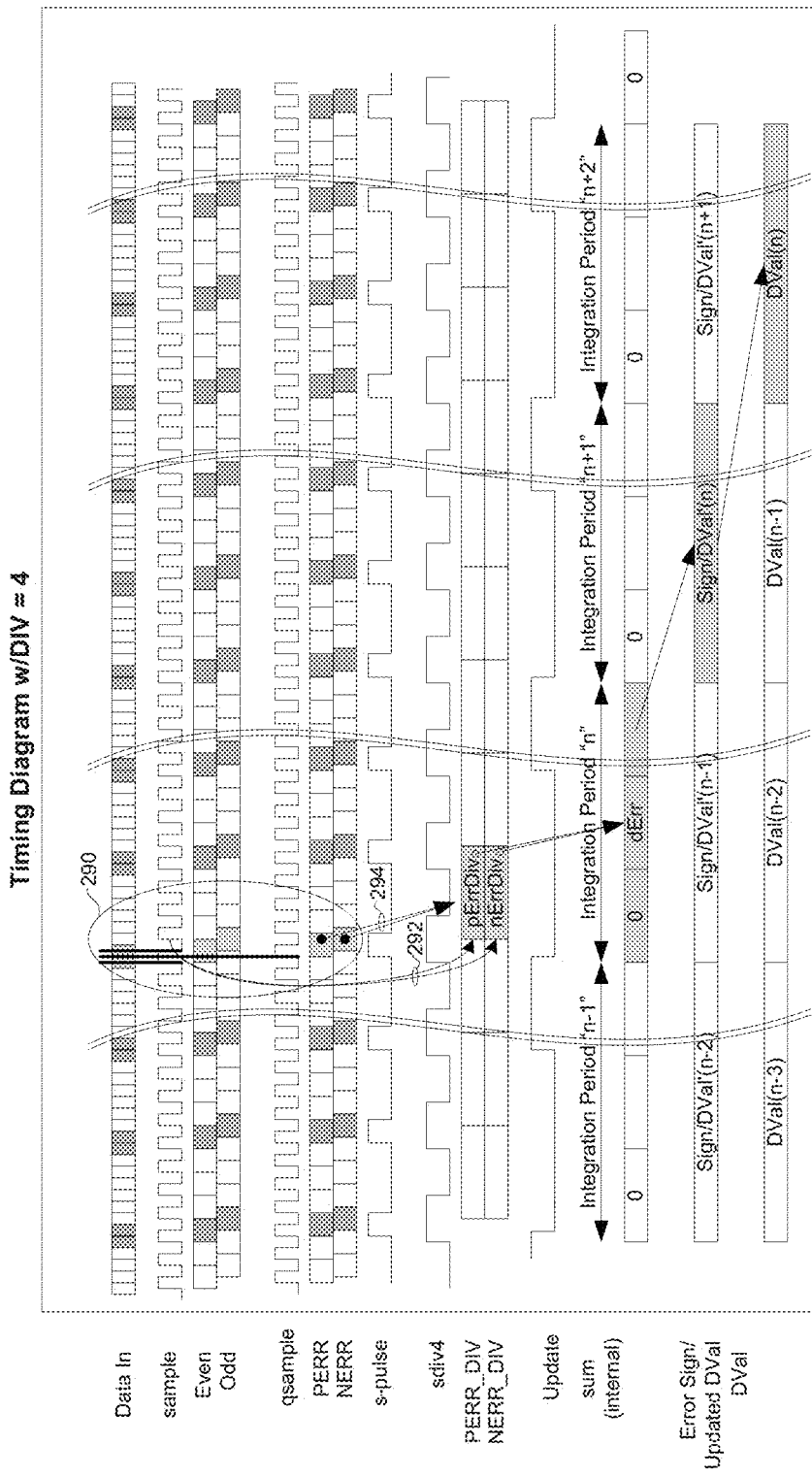
FIG. 8 is an exemplary timing diagram illustrating operation of the subrate timing calibration loop of FIG. 7 according to an embodiment having a divide-by-4 loop rate.

FIG. 8 is an exemplary timing diagram illustrating operation of the subrate timing calibration loop of FIG. 7 according to an embodiment having a divide-by-4 loop rate. That is, the subrate sampling signal cycles once for every for cycles of the sampling signal. The input data signal (Data In), sampling signal (sample), even and odd data samples (Even, Odd), and quadrature sampling signal (qsample) are applied as shown at 290 and described in reference to FIG. 3 to generate positive and negative error signals, pErr and nErr. The sampling signal is frequency divided by a factor of 4 to produce the subrate sampling signal (sdiv) and the subrate pulse (s-pulse) is generated once every four cycles of the sampling signal. By this operation, every fourth phase error indication (pErr/nErr marked by shading in FIG. 8) is captured within the error storage element (i.e., element 269 of FIG. 7) as shown at 294 in response to the rising sampling signal edge that coincides with the falling edge of the subrate pulse (i.e., as shown at 292), and output to the phase error logic as subrate phase error signals, pErrDiv and nErrDiv. The update signal, error accumulation, updated differential error signal (dErr or sign) and updated delay control value have the same timings with respect to each other as in FIG. 3, but are processed at the reduced loop rate.

Figure 9:
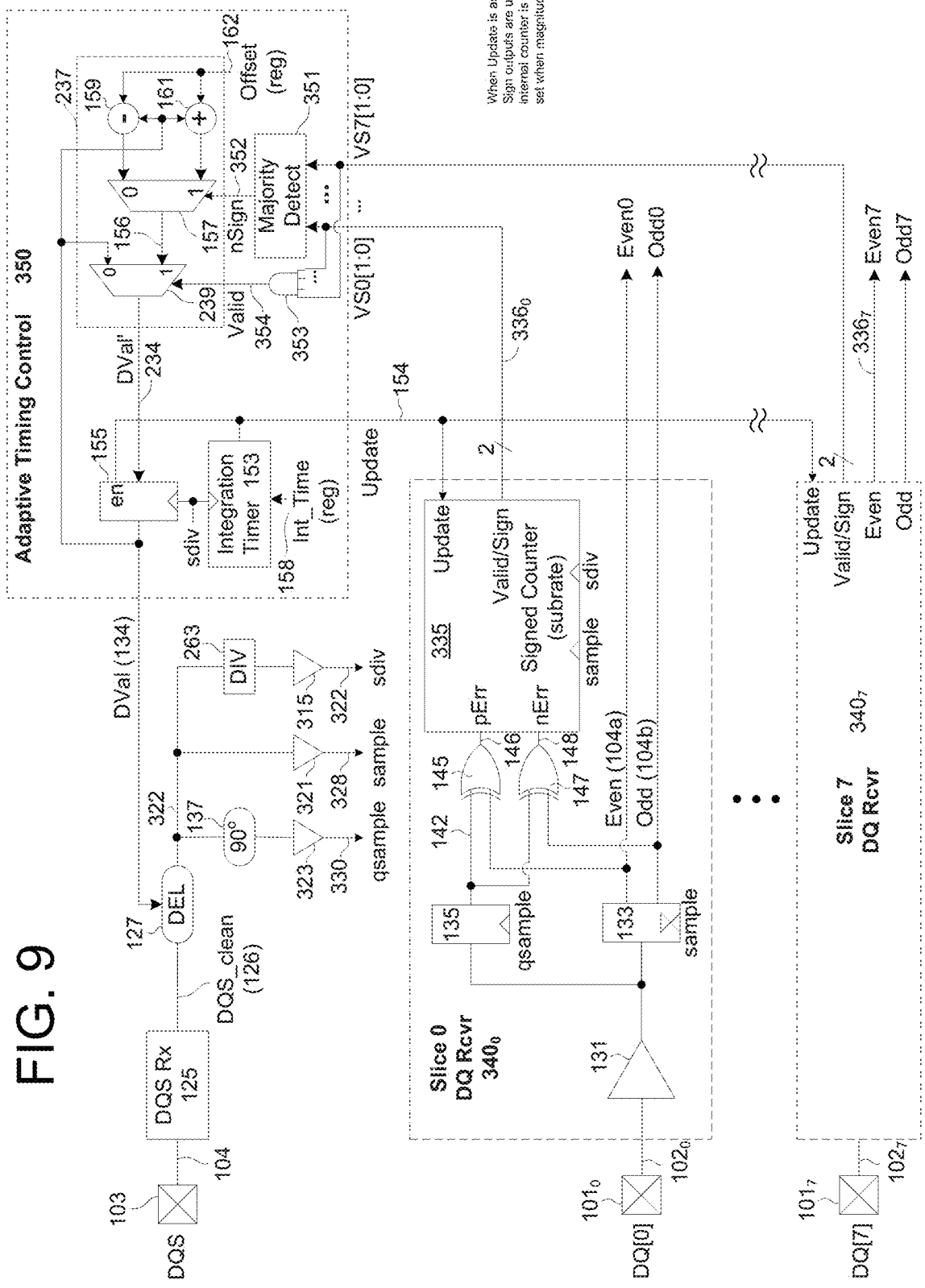
FIG. 9 illustrates an embodiment of an integrated circuit device 320 that receives a strobe signal per byte of data signals, and that includes adaptive timing calibration circuitry to delay the strobe signal as necessary to establish the data sampling point at the median of the ideal sampling times for the incoming data signals.

FIG. 9 illustrates an embodiment of an integrated circuit device 320 that receives a strobe signal 104 per byte of data signals $102_0$-$102_7$ (collectively, 102), and that includes adaptive timing calibration circuitry to delay the strobe signal 104 as necessary to establish the data sampling point at the median of the ideal sampling times for the incoming data signals 102. The incoming strobe signal 102 is received in strobe receiver 125 to generate a clean strobe signal 126, then delayed in strobe delay circuit 107 generally as described in reference to FIG. 2. The delayed strobe signal 322 is supplied to a clock driver circuit 321 to generate a sampling signal 328 (or multiple instances of the sampling signal 328, if necessary to accommodate signal fan-out) that is supplied to oversampling receivers $340_0$-$340_7$ (collectively 340) for each of the corresponding data lines $102_0$-$102_7$. The oversampling receivers 340 are also referred to herein as data slice receivers (i.e., slice 0 data receiver $340_0$-slice 7 data receiver $340_7$ as designated in FIG. 9), as each of the data lines may be viewed as corresponding to a slice of a data signaling path.

Continuing with the output of the strobe delay circuit 107, the delayed strobe signal 322 is also passed through a quadrature delay element 137 and supplied to corresponding clock driver circuit 323 to generate a quadrature sampling signal 330 (qsample) and is also passed through a divider circuit 263 and clock driver 325 to generate a subrate sampling signal 332 (sdiv). The sampling signal 328, quadrature sampling signal 330 and subrate sampling signal 332 are supplied to each of the data slice receivers 340, and the subrate sampling signal 332 is additionally supplied to adaptive timing control circuit 350. The sampling signal 328, quadrature sampling signal 330 and subrate sampling signal 332 are used within each of the data slice receivers 340 to perform the data capture and timing error detection operations described in reference to FIG. 7. Referring to the detail view of the slice 0 data receiver $340_0$, for example, the sampling signal 328 is supplied to data sampling circuit 133 to trigger generation of even and odd data samples ($140a$ and $140b$), and the quadrature sampling signal 330 is supplied to edge sampling circuit 135 to trigger generation of edge samples 142. As discussed in reference to FIG. 2, tri-samples formed by the data and edge samples are evaluated in error logic gates 145 and 147 to generate positive and negative phase error signals 146 and 148 (pErr and nErr), respectively. Logic circuitry for processing the phase error signals 146 and 148, including the logic described in reference to FIG. 7 for generating subrate phase error indications (e.g., storage element 265, logic gate 267 and error storage element 269) is disposed within subrate phase error logic 335, along with the above-described phase error logic (e.g., 235 of FIG. 7) for integrating the indicated phase errors to generate valid and sign signals for each integration period. An update signal 154 is asserted by an integration timer 153 within the adaptive timing control circuit 350 as described in reference to FIG. 2 (potentially with modified integration time 158 and clocked by the subrate sampling signal 332 to account for subrate timing), and the subrate phase error logic 335 within each of the data slice receivers $340_0$-$340_7$ responds by clearing internal count values and outputting a respective updated valid/sign bit pair, $336_0$-$336_7$ (also designated VSi[1:0], where i is the index of the data slice receiver 340), to the adaptive timing control circuit 350.

In one embodiment of the adaptive timing control circuit 350, the valid bits of the incoming valid/sign bit pairs $336_0$-$336_7$ are logically ANDed in gate 353 to produce a composite valid signal 354 (cValid), and the sign bits are supplied to a majority detection circuit 351 that outputs a majority sign 352 (mSign) that is high if the majority of the incoming sign bits are high, and low if the majority of the incoming bits are low. The composite valid signal 354 is supplied to multiplexer 239 which operates as described in reference to FIG. 6 to select, according to the composite valid signal, either an updated delay control value 156 or the active delay control value 134 to be passed, as the next-cycle delay control value 234, to the input of the delay control storage element 155. The majority sign 352 is supplied to multiplexer 158 which operates as described in reference to FIG. 6 to generate a updated delay control value 156. Because the majority sign 352 signals a positive phase error or negative phase error according to the majority indication of the incoming sign bits, the delay control value 134 is updated accordingly to adjust the propagation delay within the delay control circuit 107 in a direction counter to the majority error. By this operation, the phase of the sampling signal 328 is adaptively phase shifted to the median of the ideal sampling points within the data slice receivers 340. Note that while eight data lines 102 and corresponding data slice receivers 340 are specifically depicted in FIG. 9, there may be more or fewer data lines and data slice receivers per strobe line in alternative embodiments. Also, despite designation as data lines, various types of information may be carried on the signal lines (or any subset thereof) that correspond to a give strobe line including, without limitation masking information (e.g., indicating, for example, whether the corresponding data is to be masked when stored in a storage array), parity information, error correction code information, command or request information, configuration information and so forth.

Figure 10:
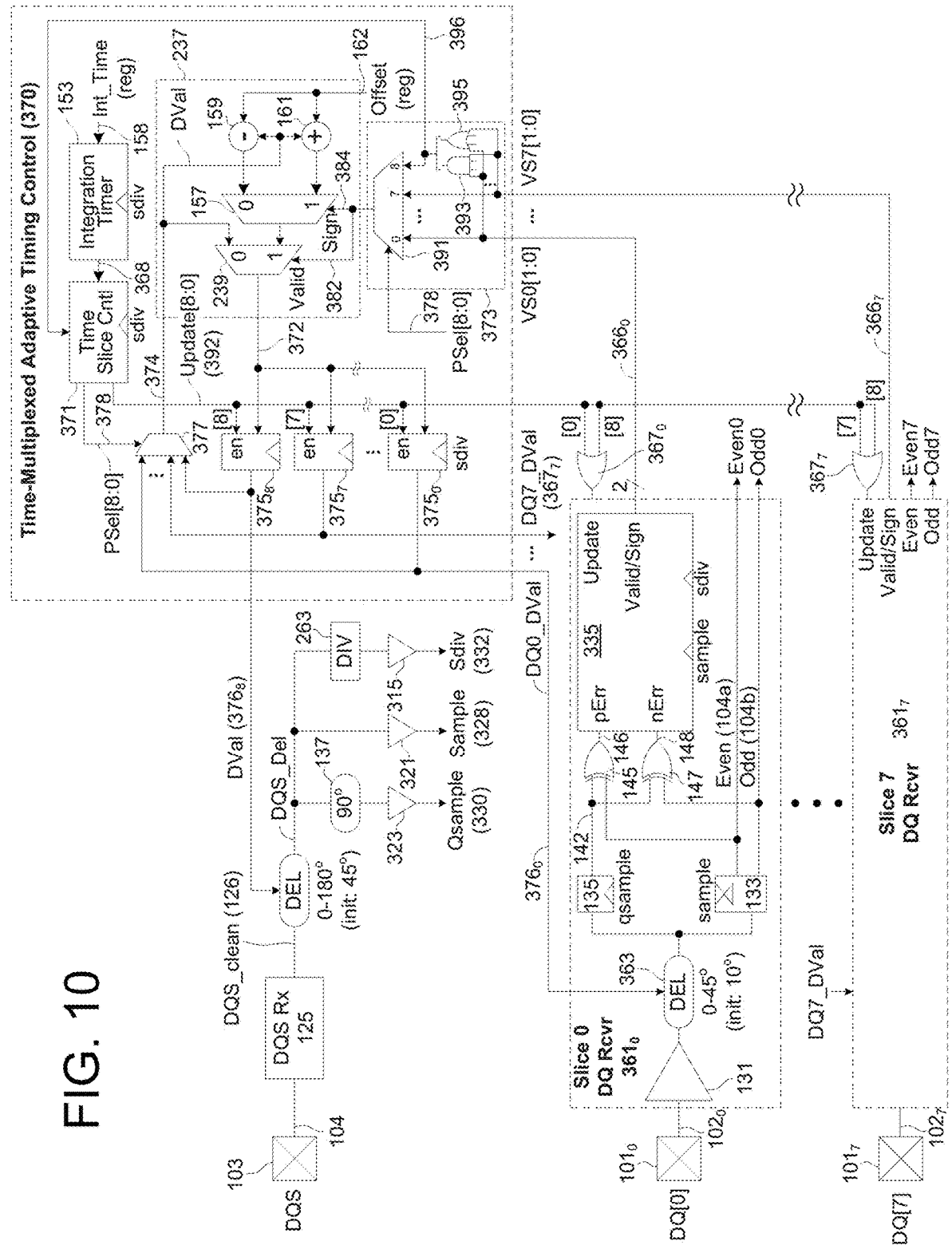
FIG. 10 illustrates an embodiment of an integrated circuit device that receives a strobe signal per byte of data signals as in FIG. 9, and that includes adaptive timing calibration circuitry to delay both the strobe signal and the incoming data signals as necessary to sample each of the data signals at a respective desired sampling instant.

FIG. 10 illustrates an embodiment of an integrated circuit device 360 that receives a strobe signal per byte of data signals as in FIG. 9, and that includes adaptive timing calibration circuitry to delay both the strobe signal and the incoming data signals as necessary to sample each of the data signals at a respective desired sampling instant. As in the embodiment of FIG. 9, the IC device 360 includes input nodes $10_3$ and $101_0$-$101_7$ to receive, respectively, a strobe signal 104 and data signals $102_0$-$102_7$. The strobe signal 104 is received and cleaned in the strobe signal receiver 125, delayed in strobe delay circuit 107 and then distributed (via quadrature delay element 137, divider 263 and clock drivers 321, 323 and 325) to data slice receivers $361_0$-$361_7$ in the form of a sampling signal 328 (sample), quadrature sampling signal 330 (qsample) and subrate sampling signal 332 (sdiv) generally as described above.

Each of the data slice receivers $361_0$-$361_7$ includes an amplifier 131, sampling circuits 133 and 135, error logic gates 145 and 147 and subrate phase error logic 335 which operate generally as described in reference to FIG. 9 to generate a sequence of tri-samples (each including an even and odd data sample $140a$ and $140b$, and an edge sample 142), integrate a phase error value according to the tri-samples (or subrate-selected set of tri-samples), and signal the phase error to the adaptive timing control circuit in the form of a sign/valid bit pair. Each of the data receivers additionally includes a data delay circuit 363 coupled between input amplifier 131 and sampling circuits 133 and 135 to enable the incoming data signals $102_0$-$102_7$ to be delayed by respective delays before being sampled in response to the sampling signal 328 and quadrature sampling signal 330. The data delay circuit 363 within each of the data slice receivers $361_0$-$361_7$ exhibits a propagation delay selected from a range of propagation delays in response to a respective data delay value received from adaptive timing control circuit 370, thus enabling the adaptive timing control to shift the phase of the sampled data signals (i.e., the delayed data signals output from respective data delay circuits 363) relative to one another and relative to the sampling clock signal 328 and quadrature sampling clock signal 330.

The adaptive timing control circuit 370 includes an integration timer 153 and delay control update circuit 237 (i.e., including multiplexers 239, 157 and arithmetic circuits 159 and 161) which operate generally as described in reference to FIG. 9, but, in contrast to the FIG. 9 embodiment, includes multiple delay control storage elements $375_0$-$375_8$ to store respective delay control values that are applied to control propagation delays in the data delay circuits 363 of data slice receivers $361_0$-$361_7$ and in the strobe delay circuit 107. In the embodiment of FIG. 10, the adaptive timing control circuit 370 further includes a time slice controller 371 and error multiplexing logic 373 to enable time-multiplexed processing of the phase errors $366_0$-$366_7$ (i.e., valid/sign bit pairs, VS0[1:0]-VS7[1:0]) provided by the data slice receivers $361_0$-$361_7$. In the particular embodiment shown, each of the phase error bit pairs VS0[1:0]-VS7[1:0] is supplied to a respective input port of an error multiplexer 391 within the error multiplexing logic 373, and additionally to logic gates 393 and 395 which generate a composite phase-error bit pair 396. More specifically, logic gate 395 combines the sign bits in a logic OR combination and therefore generates a logic '1' composite sign bit so long as at least one of the input sign bits indicates that the sampling signal is early relative to the desired sampling instant for that data slice receiver (i.e., so long as at least one of the input sign bits is high). Thus, the composite sign bit tracks the state of the sign bit for the data slice receiver 361 having the latest desired sampling instant, referred to herein as the most latent data slice receiver. Logic gate 393 combines the valid bits in a logic AND combination and thus generates a composite valid signal that qualifies the composite sign bit as valid when each of the data slice receivers $361_0$-$361_7$ indicate that their respective sign bits are valid.

Still referring to FIG. 10, the time slice controller 371 receives an interval-complete signal 368 from integration timer 153 (marking the conclusion of an integration period) and responds by outputting a one-hot update value 392 (Update[8:0]), and by outputting a one-hot phase select value 378 (PSel[8:0]) to select a valid/sign bit pair (382, 384) via error multiplexer 391 (i.e., a phase error signal $366_0$-$366_7$ from one of the data slice receivers or from the compositing logic gates 393, 395) and an active one (374) of the delay control values $376_0$-$376_8$ via multiplexer 377 to be applied within delay control update circuit 237 to generate an new delay control 372. Individual bits of the update value are coupled to the respective enable inputs of the delay control storage elements $375_0$-$375_8$ so that, at the conclusion of the integration period in which the new delay control value 372 is generated, the appropriate bit of the update value 392 may be raised (i.e., as the one-hot bit of the set of bits) to load the new delay control value 372 into a selected one of the delay control storage elements $375_0$-$375_8$. Thus, the time slice controller 371 provides control over which of the delay control values 376 supplied to the various delay control circuits 363 and 107 is updated at the conclusion of a given integration period.

In one embodiment, the time slice controller 371 includes state logic (e.g., as in a finite state machine) that operates to initially adjust the delay within the strobe delay circuit 107 (i.e., adjusting the delay control value $376_8$) until the sampling signal 328 is aligned with the desired sampling instant of the most latent data slice receiver 361. Thereafter, the time slice controller 371 leaves the delay control value $376_8$ for the strobe delay circuit unchanged and begins one-by-one (i.e., round-robin) adjustment of the delay control values $376_0$-$376_7$ supplied to the data delay circuits 363 within the data slice receivers 361 to align the desired sampling instant for each of the incoming data signals 102 with the sampling signal 328. In the embodiment of FIG. 10, the time slice controller 371 outputs the phase select value in a one-hot state (i.e., one bit of PSel[8:0] is high) to select the particular delay control value 376 to be updated at the next assertion of the interval-complete signal 368, then asserts the update signal 392 in a one-hot state to load an updated delay control value into a corresponding delay control storage element 375 and to latch a new valid/sign value (and reset error counters) within the subrate phase error logic 335 of the corresponding data slice receiver 361. In the case of the strobe delay circuit 107, the time slice controller raises PSel[8] to select delay control storage element $375_8$ to source the active delay control value to the delay control update circuit 237 (i.e., to the arithmetic logic circuits 159 and 161, and to hold-multiplexer 239), and, when the interval-complete signal 368 is asserted by the integration timer 153, raises Update[8] to load the new (i.e., updated or held) delay control value 372 into delay control storage element $375_8$. In contrast to the delay control values $376_0$-$376_7$ for the data delay circuits 363 which are generated in response to the valid/sign bit pair from a corresponding one of the data slice receivers 361, the strobe delay control value $376_8$ is generated, at least in the embodiment of FIG. 10, based on the composite valid/sign bit pair 396 and thus based on the phase error signals 366 from all the data slice receivers 361. Accordingly, in the embodiment of FIG. 10, the phase error logic circuit 335 within each of the data slice receivers $361_0$-$361_7$ is updated (i.e., latch updated sign/valid bit pair at output and reset internal counters) in response to assertion of Update[8]. As shown, OR gates $367_0$-$367_7$ are provided to OR signal Update[8] with signals Update[7]-Update[0], respectively, to generate the signals applied to the update inputs of the phase error logic circuits 335 within data slice receivers $361_0$-$361_7$.

Figure 11A:
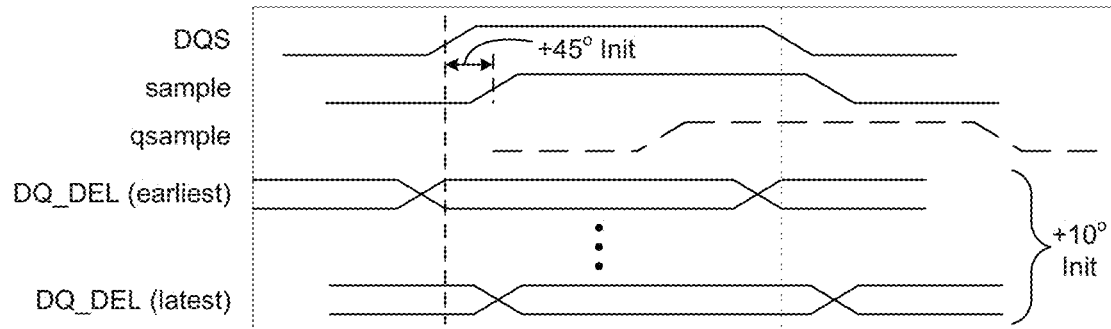
FIGS. 11A-11D are exemplary timing diagrams that illustrate the adaptive timing calibration approach described in reference to FIG. 10.
Figure 11B:
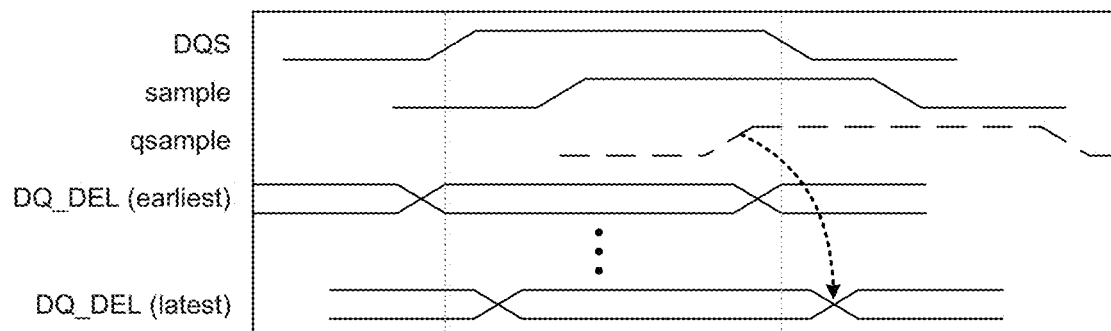

FIGS. 11A-11D are exemplary timing diagrams that illustrate the adaptive timing calibration approach described in reference to FIG. 10. In the particular example shown, the incoming strobe signal is initially nominally edge-aligned with the incoming data signals as depicted in FIG. 11A. Thus, to achieve a quadrature relationship between the midpoint of the data eyes and a phase-delayed strobe signal (i.e., the sampling signal), the strobe delay should eventually settle at 90° plus or minus an adaptively determined phase offset. Accordingly, to ensure that the sampling signal is phase advanced relative to the latest of the incoming data signals, the strobe delay is initially set to delay the sampling signal by 45° as shown in FIG. 11A, thus allowing the strobe delay to be adaptively increased and thereby shifted toward the eventual settling point. Also, to provide a level of phase-advance headroom for the data signals, the data signal delays are initially set to delay the data signals by 10° relative to the incoming strobe signal edge. Other initial phase angles (i.e., delay selections) may be established for the strobe and data signals in alternative embodiments. Also, while not specifically shown, host-instructed write and/or read access to the delay control storage elements may be provided to enable initial delay control values to be written therein in response to host instructions or to enable the delay control values to be read out, for example, as status information to support run-time configuration decisions and/or device testing.

Referring to FIGS. 10 and 11, the time slice controller 371 initially raises PSel[8] to enable the delay control value $376_8$ for the strobe delay circuit 107 to be adjusted and responds to each assertion of the interval-complete signal 368 by asserting Update[8], thereby enabling an updated delay control value to be captured within delay control storage element $375_8$ and updating the phase error logic circuits 335 (i.e., latching sign/valid bit pairs and clearing internal counters) within each of the data slice receivers 361. As shown in FIG. 11B, this operation iteratively (adaptively) adjusts the phase of the sampling signal toward alignment with the latest of the delayed data signals.

Figure 11C:
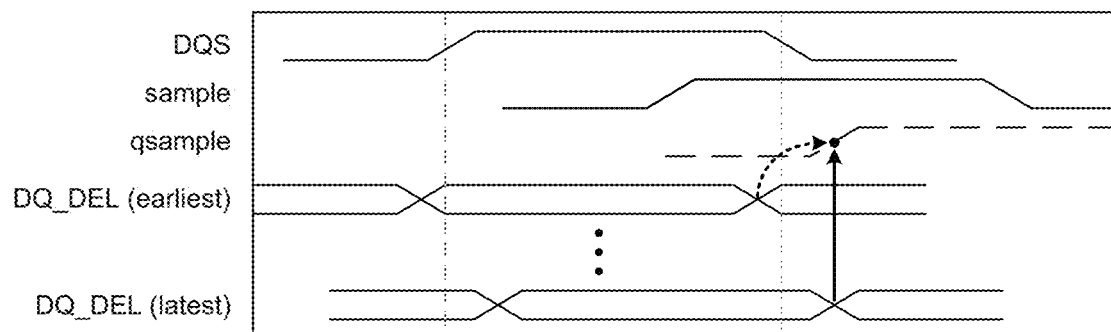
Figure 11D:
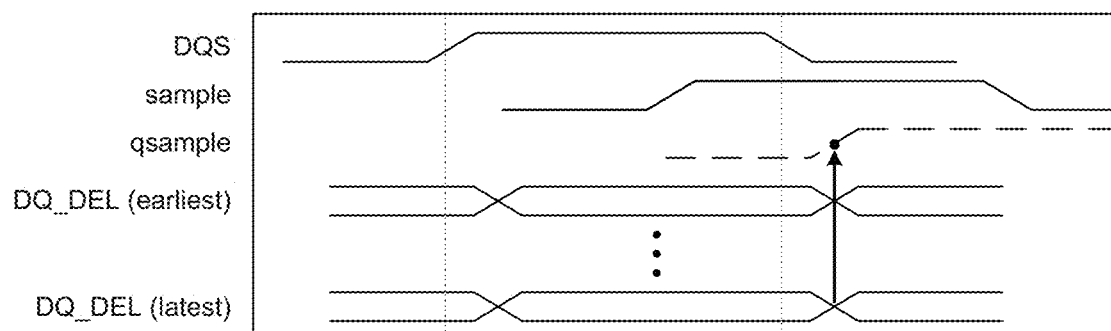

In one embodiment, the time slice controller 371 monitors the composite valid/sign bit pair 396 to determine when the sampling signal reaches alignment with the latest of the delayed data signals (e.g., by detecting dithering of the composite sign bit, as qualified by the composite valid bit) and, upon detecting the desired phase alignment, switches to a data-delay mode in which the delay control values $376_0$-$376_7$ for the data delay circuits 363 are adaptively updated to establish phase alignment between the delayed data signals (or desired sampling instants thereof) and the sampling signal. In the embodiment of FIG. 10, for example, the time-slice controller 371 raises PSel[0]-PSel[7] in round-robin fashion (one after another) in successive integration periods to select the delay control value to be updated, and asserts the corresponding one of update signals Update[0]-Update[7] at the completion of each integration period to load an updated delay control value into the corresponding one of delay control storage elements $375_0$-$375_7$, and to update the phase error logic 335 within the corresponding data slice receiver 361. This operation is illustrated in FIG. 11C which depicts the resulting phase shift of delayed data signals toward alignment with the sampling signal (i.e., the quadrature sampling signal (qsample) is edge-aligned with the delayed data signals and sampling signal (sample) is quadrature-aligned with the delayed data signals) and in FIG. 11D which illustrates the desired alignment between the sampling signal and all the delayed data signals. Once the desired alignment is reached, timing control circuit 370 adaptively maintains the desired alignment over gradual changes in voltage and temperature.

Still referring to FIGS. 10 and 11, it should be noted that numerous features and options may be implemented within the adaptive timing calibration circuitry of IC device 360 in alternative embodiments. For example, the time slice controller 371 may include circuitry (e.g., state machine circuitry or microcontroller circuitry) to interrupt round-robin processing of the phase errors 366 signaled by the data slice receivers 361 in response to detecting an invalid signal (e.g., valid signal low) for the data slice receiver presently being serviced. That is, instead of proceeding to service the next data slice receiver, the time-slice controller 371 may repeat selection of the data slice receiver that yielded the invalid phase error 366 in the ensuing integration period. More generally, instead of time-multiplexed processing of the phase errors indicated by the data slice receivers 361, the adaptive timing control circuitry 370 may be modified to include separate delay control update circuitry for each (or sub-groups) of the data slice receivers $361_0$-$361_7$, thereby enabling all (or sub-groups) of the data signals to be phase-adjusted in parallel. A separate delay control update circuitry may also be provided for the strobe signal.

Figure 12:
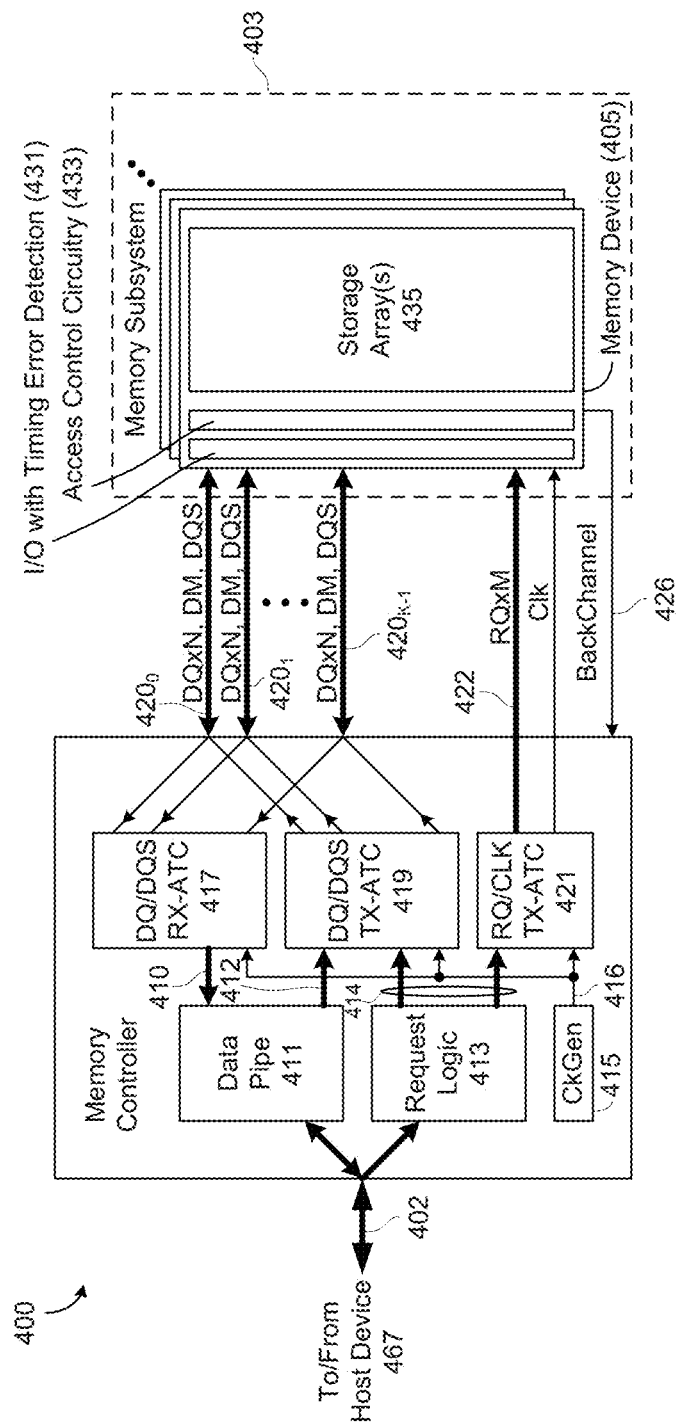
FIG. 12 illustrates a memory system having a memory controller and a memory subsystem that employ the above-described adaptive timing calibration techniques to establish and maintain desired phase relationships between various data, strobe, control and clock signals.

FIG. 12 illustrates a memory system 400 having a memory controller 401 and a memory subsystem 403 that employ the above-described adaptive timing calibration techniques to establish and maintain desired phase relationships between various data, strobe, control and clock signals. In the particular embodiment shown, adaptive timing calibration circuitry is distributed between the memory controller 401 and one or more memory devices 405 that form the memory subsystem 403 so as to limit the complexity of the more numerous and cost-sensitive memory devices 405 and thus dispose the error processing and adaptive timing control circuitry predominantly within the memory controller 401. Accordingly, in addition to a data pipe 411 for managing the flow of read, write and configuration data between a host device 407 (e.g., one or more processors, direct-memory-access controllers, application-specific integrated circuits, etc. coupled to the memory controller 401 via one or more host-access paths 402) and the memory subsystem 403, and request logic 413 for forwarding read, write, maintenance and configuration requests to the memory subsystem 403, the memory controller is provided with adaptive timing calibration circuits 417, 419 and 421 for establishing a desired phase relationship between data signals 410 and strobe signals received from the memory devices 405 (DQ/DQS RX-ATC, 417), and between data and strobe signals 412 transmitted to the memory devices 405 (DQ/DQS TX-ATC, 419) and between request signals, strobe signals and one or more clock signals (shown generally at 414) transmitted to the memory devices (RQ/CLK TX-ATC, 421), respectively.

In the embodiment of FIG. 12, data is transferred bidirectionally between the memory controller 401 and memory devices 405 with each set of N data links (DQxN) being associated with a mask link (DM) and a data strobe link (DQS) to form a signaling path referred to herein as a data lane 420. In one embodiment, N is eight, thereby establishing byte-wide data lanes or byte lanes, though more or fewer data links may be provided per data lane 420 in alternative embodiments. The data strobe link is used to convey a strobe signal that is output from the transmitting device (i.e., memory controller 401 or one of memory devices 405) synchronously with respect to data and mask signals output on the corresponding data links and mask link and thus provides a source-synchronous timing reference for sampling the data and mask signals. The mask link may be used to convey masking information during data write operations (i.e., a mask bit that indicates whether the corresponding data byte is to be written) or may be used to convey additional data information or error checking information such as a parity bit or portion of an error correction code. Similarly, during read operations, the mask link may be used to convey read masking information to the memory controller 401 (i.e., indicating whether the corresponding read data byte is valid) or an additional read bit or error checking information. In one embodiment, data and mask signals are output in response to both rising and falling edges of a timing reference to establish double data rate transmission (i.e., two symbols transmitted per link per cycle of the timing reference). In alternative embodiments, more or fewer symbols may be transmitted per cycle of the timing reference to effect higher or lower data rates.

Although each of k data lanes $420_0$-$420_{k-1}$ is depicted as coupled between the memory controller 401 and a given memory device 405 of the memory subsystem, the data lanes 420 may alternatively be allocated in subsets to respective memory devices 405 according to the width of the memory device data interfaces. For example, in a memory system having eight byte-wide data lanes (i.e., 128 bit data path+8 bit mask path) and populated with memory devices each having a 32-bit wide data interface, four memory devices may be coupled to respective groups of four of the data lanes and thus establish a rank of memory devices that is accessed as a unit (i.e., all memory devices in the rank are enabled to participate in a given memory read or write transaction). In such an embodiment, the memory devices may be disposed, for example, on memory module (e.g., a dual in-line memory module (DIMM) or single in-line memory module (SIMM)) together with a serial presence detect (SPD) storage device or other non-volatile storage device that indicates the storage capacity and operational capabilities of the memory devices. For example, the non-volatile storage device may indicate whether the memory devices include oversampling circuitry for gathering phase error information that may be used for adaptive timing calibration. Accordingly, the memory controller may read the non-volatile storage device to determine whether the memory subsystem or some subset of the memory devices therein include circuitry to support adaptive timing calibration and, if so, operate the memory system in an adaptive timing calibration mode instead of a conventional operating mode. In alternative embodiments, the memory devices and/or non-volatile storage may be disposed on the same circuit board as the memory controller or integrated into a multi-chip module along with the memory controller 401 and/or host device 407 to form, for example, a system-in-package (SIP) DRAM system. Also, multiple ranks of memory devices may be coupled to the data lanes in a bussed, multi-drop configuration (i.e., each data lane or any subset thereof coupled to more than one memory device), or additional data lanes (not shown in FIG. 12) may be provided to enable point-to-point coupling of the memory controller to multiple ranks of memory devices. The data lanes 420, request path 422, clock line 424 and/or backchannel 426 coupled between the memory devices 405 (or memory modules) and the memory controller 401 may be implemented by virtually any signaling channel, including an electronic signal conduction path, optical signal conduction path or wireless signaling channel. Further, the host device 407, memory controller 401, and/or one or more of memory devices 405 may be combined on a single integrated circuit die in an alternative embodiment.

In the embodiment of FIG. 12, memory requests, including memory read and write requests (collectively referred to herein as memory access requests) and configuration requests, are transmitted to the memory subsystem 403 via an M-bit request path 422 (RQ) in synchronism with a master clock signal (Clk) transmitted on clock line 424. The master clock signal may be generated within the memory controller 401 or elsewhere within the host system (i.e., the larger system in which the memory system 400 is a component). In one embodiment, the request path 422 is coupled in parallel to each of the memory devices 405 within the memory subsystem 403 and selected subsets of the memory devices 405 (e.g., ranks of memory devices) are enabled to receive and/or respond to a given memory request through a chip-select protocol (e.g., chip-select line coupled to an address-specified rank of memory devices 405 is asserted while chip-select lines for all other memory devices 405 remain low), request protocol (e.g., requests transmitted via path 422 include ID of memory device(s) or memory rank that is to respond to a given memory request) or any other device selection mechanism. Though shown as a unidirectional signaling path, the request path 422 may alternatively be a bi-directional path, for example, to enable request, status or control information to be conveyed from the memory subsystem 403 to the memory controller 401.

In the embodiment of FIG. 12, each of the memory devices 405 includes an input/output (I/O) interface 431, access control circuitry 433, and one or more storage arrays or storage banks 435. The I/O interface 431 is provided to sample (capture) incoming requests and write data (or configuration data) in response to the master clock signal and data strobe signals, respectively, and to output read data (or status information) to the memory controller along with corresponding data strobe signals. As discussed in further detail below, timing error detection circuitry is provided within the I/O circuitry to oversample the incoming data and request signals and thereby generate phase error information that may be returned to the memory controller via backchannel communication. The backchannel may be implemented by a dedicated signaling path 426 (e.g., a serial I/O path) as shown in FIG. 12, or by unused bandwidth within one or more of the request path 422 and data lanes 420. For example, the phase error information may be time-multiplexed onto the data lanes 420 and/or request path 422.

Still referring to memory devices 405, the access control circuitry 433 responds to incoming memory access and configuration requests by enabling selected logic circuits to carry out the requested operation. In a dynamic random access memory (DRAM) embodiment, for example (i.e., storage array(s) implemented by DRAM cells), the access control circuitry 433 may include row-decode circuitry for carrying out row activation operations and precharge operations in an address-selected row and storage bank, as well as column-decode circuitry for carrying out column access operations in an activated row. The access control circuitry 433 may additionally include read and write data pipes to enable pipelined read and write transactions within the memory device (i.e., access to an activated row, while data for a preceding or following transaction is output from the read data pipe or loaded into the write data pipe), as well as configuration circuitry for configuring the operation of the memory device 405, including one or more one-time or run-time programmable registers for establishing adaptive timing calibration parameters including, for example and without limitation, as the integration time 158, delay adjust offset 162, error validity threshold 248 described above in reference to FIG. 10 and other embodiments, and more generally to allow any aspect of memory device operation that may need to be adjusted in response to run-time operating conditions or application needs to be programmed in response to configuration commands from the memory controller or other control device.

Embodiments of adaptive timing calibration circuitry implemented within the memory controller 401 and memory devices 405 of FIG. 12 are described in greater detail below in the context of a more particular memory system. It should be understood in all such cases, that particular details such as number of data lines per data lane, distribution of adaptive calibration circuitry between memory controller and memory device, and the selection of phase alignments between signals or sets of signals may be varied according to application needs. Also, while the adaptive timing calibration circuitry is described in reference to a memory system, the adaptive timing calibration circuitry, including the circuitry and techniques described above, may be applied in other signaling systems, including master/slave signaling systems or any other system where adaptive calibration of phase offsets between related signals may be useful.

Figure 13:
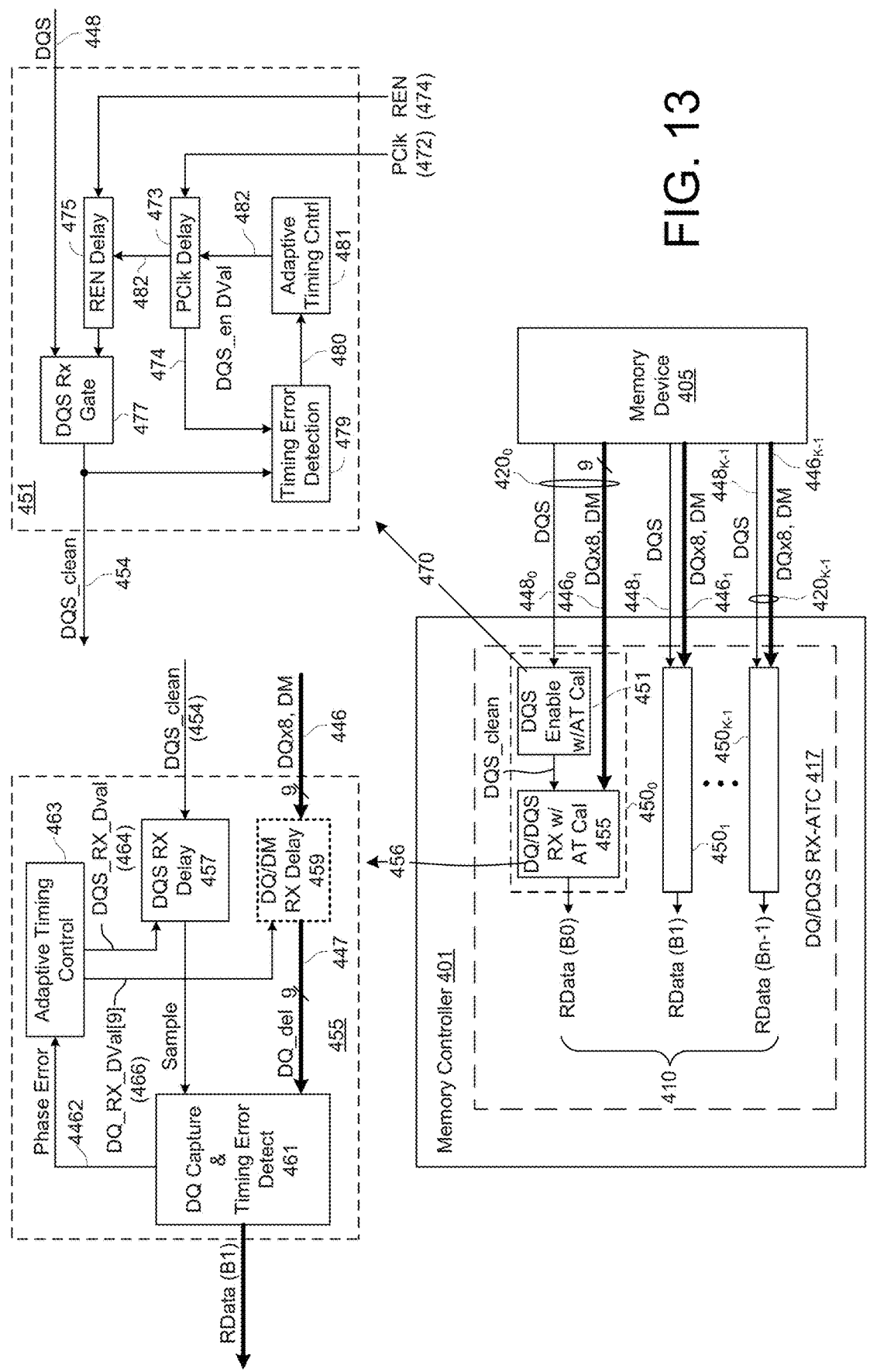
FIG. 13 illustrates an exemplary embodiment of the data-strobe receive interface with adaptive timing calibration circuitry within the memory controller of FIG. 12 and its interconnection to a memory device.

FIG. 13 illustrates an exemplary embodiment of the data-strobe receive interface with adaptive timing calibration circuitry (DQ/DQS RX-ATC 417) within the memory controller of FIG. 12 and its interconnection to a memory device 405. As shown, the data lanes $420_0$-$420_{k-1}$ are coupled to respective byte receivers $450_0$-$450_{k-1}$. The data lanes are depicted as byte lanes in this example, and each include eight data lines and a data mask line (collectively 446) to convey data signals, DQx8, and data mask signal, DM, and a corresponding strobe line 448 to convey strobe signal, DQS. As shown in the exemplary expanded view of byte receiver $450_0$, each of the byte receivers $450_0$-$450_{k-1}$ includes a strobe enable circuit 451 and data/strobe receiver 455 themselves shown, for example, in detail views 470 and 456, respectively. Referring first to detail view 456, the data/strobe receiver 455 includes a strobe delay circuit 457, a set of data delay circuits 459 (one for each of the incoming data signals and for the incoming mask signal), data capture and timing error detection circuit 461, and adaptive timing control circuit 463 each of which operate generally as described in reference to FIG. 10 to delay the incoming strobe signal 454 (DQS_clean) to yield a delayed strobe signal (i.e., sample signal 460) that is aligned with the latest of the data signals and mask signal 446, and then to delay the data signals and mask signal as necessary to achieve alignment between delayed versions of those signals, DQ_del 447, and the delayed strobe signal. More specifically, the data capture and timing error detection circuit 461 oversamples the incoming data and mask signals 446 to generate a phase error signal 462, and adaptive timing control circuit 463 responds to the phase error signal 462 by adaptively updating a strobe delay control value (DQS_RX_DVal 464) and a set of data delay control values (DQ_RX_DVal[9] 466) that are used to delay the incoming data signals and mask signal individually.

Referring to detail view 470, the strobe enable logic is provided to convert a three-state strobe signal 448 (i.e., a signal that starts in at mid-level parked state, then transitions between high and low states to signal presence of valid data on the corresponding data and mask lines) to a clean binary strobe signal 454 (DQS_clean). In the embodiment of FIG. 13, the nominal time at which the incoming strobe signal 448 transitions from the parked state to a high or low state is deterministic with respect to a memory request issued by the memory controller. That is, due to the synchronous operation of the memory devices with respect to requests issued by the memory controller, the memory controller may expect to receive a responsive transmission a predetermined number of cycles of an internal logic clock signal 472 (PClk) after transmission of a corresponding request. Thus, the memory controller may, at least in theory, assert a read-enable signal 474 (REN) after the predetermined number of PClk cycles have transpired to enable the incoming strobe signal transitions to pass through the strobe enable logic 451 and be output in the DQS_clean signal 454 (i.e., the read-enable signal 474 acts as a gating signal, selectively enabling the incoming strobe signal 448 to be passed by strobe gating circuit 477 as the DQS_clean signal 454). One complication in this operation is that the timing of the strobe signal preamble (i.e., the time between the strobe signal transition from the parked state to the first data-indicating strobe signal transition) relative to the logic clock signal 472 may drift considerably over time due to voltage and temperature variations. Consequently, merely asserting the read-enable signal 474 in synchrony with the logic clock signal 472 (i.e., after the predetermined number of PClk cycles have transpired) is generally insufficient, as the phase offset between the logic clock signal 472 and the desired enable point within the strobe signal preamble may result in assertion of the read-enable signal 474 too near the start or end of the strobe signal preamble and, consequently, a spurious transition (i.e., glitch) or missed transition in the DQS_clean signal 454, either of which may result in data reception failure.

In one embodiment, an initialization-time calibration operation is performed to compensate for phase offset between the logic clock signal 472 and the desired enable point in the incoming strobe signal preamble. More specifically, the read-enable signal 474 is stepped (swept) through a range of phase delays to identify maximum and minimum phase delays that bound the range of error-free operation (i.e., phase delays beyond which glitches or missed transitions occur), and then positioned at a mid-point between the maximum and minimum phase delays. Unfortunately, this approach, while acceptable in some applications, suffers from the same susceptibility to drift-induced failure as other static calibration operations. That is, as with one-time calibration of strobe signal delays, temperature and voltage drift may shift the ideal read-enable setpoint over time, reducing timing margins and increasing the likelihood of signaling errors.

In the embodiment of FIG. 13, the phase delay of the read-enable signal 474 is adaptively calibrated to maintain a desired read-enable timing over changes in temperature and voltage and to compensate for any systematic phase offset between logic clock signal 472 and the strobe signal preamble. More specifically, logic clock signal 472 propagates through a clock delay circuit 473 to generate a delayed logic clock signal 474 which is applied, in turn, to oversample the DQS_clean signal 454 in strobe timing error detection circuit 479. Through this oversampling operation, phase error information is obtained and passed as error signal 480 to adaptive timing control circuit 481 which adaptively updates a delay control value 482 (DQS_en DVal) used to control the propagation delay through the clock delay circuit 473. Through this closed-loop arrangement, the delayed logic clock signal 474 is adaptively shifted into (and thereafter maintained in) alignment with a midpoint of the strobe signal preamble (i.e., nominally midway between the strobe signal transition from parked to high or low state and the first data-indicating transition of the strobe signal). Further, the delay control value 482 is additionally supplied to a read-enable delay circuit 475 to delay the read-enable signal 474 (REN). In one embodiment, the read-enable signal 474 is initially synchronized with the logic clock signal 472 so that, by delaying the read-enable signal 474 and logic clock signal 472 by the same propagation delay, the read-enable signal is also aligned with a midpoint (or at least a desired enable point) of the strobe signal preamble. Because the delay control value 482 is adaptively updated during runtime operation, the read-enable signal is adaptively shifted to and maintained in a desired phase relationship with respect to the strobe signal preamble despite systematic phase offset (i.e., static phase offset) between the logic clock signal 472 and strobe signal preamble or gradual phase changes between the logic clock signal 472 and strobe signal preamble that might otherwise develop due to temperature or voltage drift, or other sources of dynamic phase error. A more detailed circuit embodiment for adaptively adjusting the phase of the strobe-enable signal is described below in reference to FIG. 19.

Figure 14:
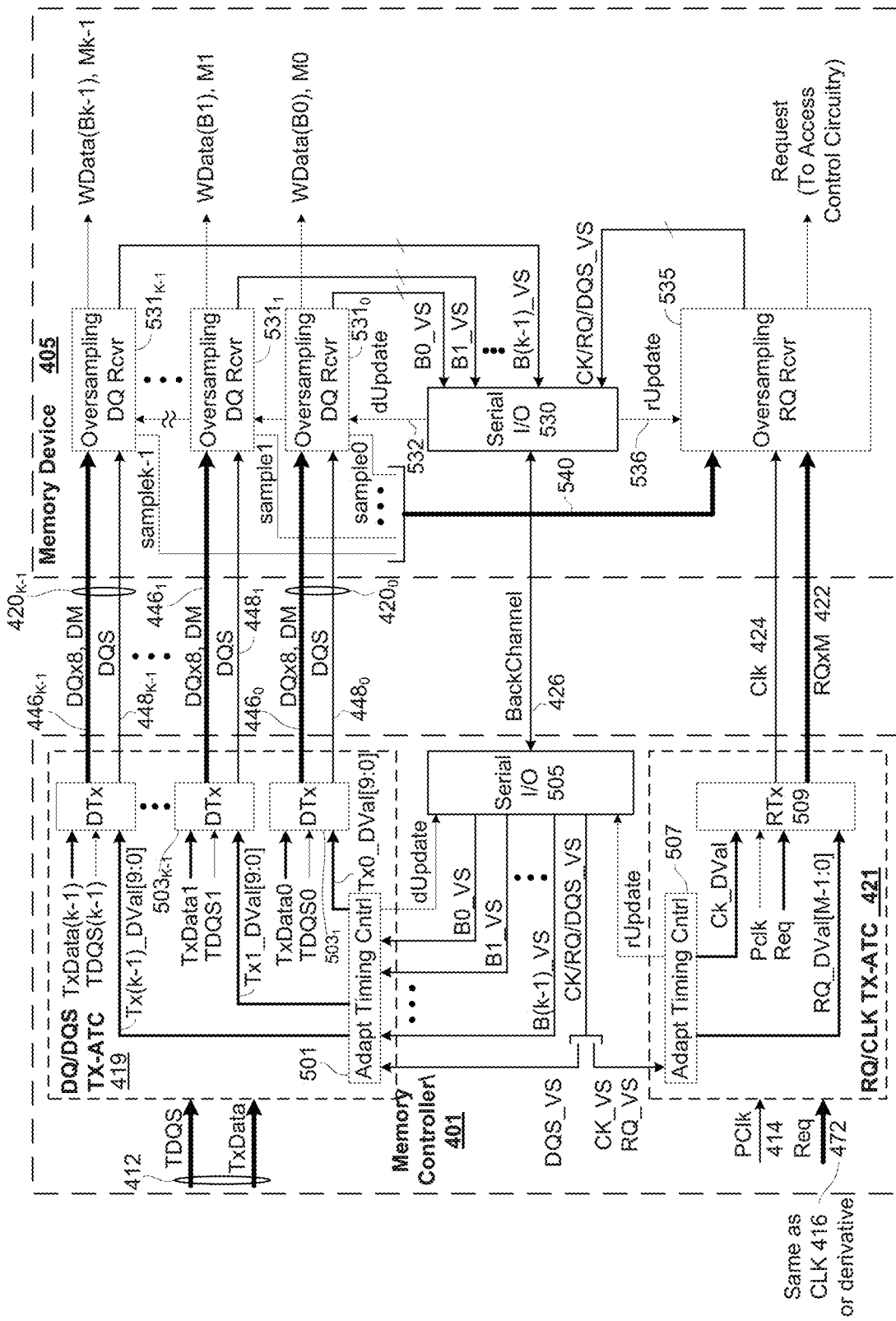
FIG. 14 illustrates a distribution of adaptive timing calibration circuitry between the memory controller and a memory device of FIG. 12 to support adaptive timing calibration of the clock, data and request signals transmitted from the memory controller to the memory device.

FIG. 14 illustrates a distribution of adaptive timing calibration circuitry between the memory controller 401 and a memory device 405 of FIG. 12 to support adaptive timing calibration of the clock, data and request signals transmitted from the memory controller to the memory device. Overall, the distributed adaptive timing circuitry operates in generally the manner described in reference to FIG. 2, but with the error detection circuitry and adaptive timing control circuitry split between the memory device 405 and memory controller 401, respectively. Thus, each of the byte lanes 420$_0$-420$_{k-1}$ is coupled to a respective oversampling data receiver 531$_0$-531$_{k-1}$ (i.e., each having data capture and timing error detection circuit functions) within the memory device 405 and is driven, within the memory controller 401, by a respective phase-compensating transmitter 503$_0$-503$_{k-1}$ (DTx) that delays transmission of the data, mask and strobe signals in accordance with respective delay values Tx0_DVal[9:0]-Tx(k−1)[9:0] provided by adaptive timing control circuit 501.

Starting with the memory device side of the adaptive calibration circuitry, each oversampling data receiver samples signals conveyed on a respective data and mask line set (446) in response to a strobe signal conveyed on the corresponding strobe line 448 and a quadrature-delayed version of the strobe signal to recover a respective data byte and mask bit (WData, M) and to generate phase error information for each of the constituent data signals and mask signal. In one embodiment, the phase error information includes a set of valid/sign bit pairs (e.g., 9 bit pairs, including 8 for the individual data signals and one for the mask signal) designated Bi_VS in FIG. 14, where i is the byte lane index, 0 to k−1. Alternatively, the valid bits may be ANDed together to form a composite valid bit and/or the sign bits may be combined in a majority detector circuit as described in reference to FIG. 9, to generate a composite sign bit. In either case, the error information for each byte lane $420_0$-$420_{k-1}$ is supplied to a serial I/O controller 530 which forwards the error information to the memory controller via back channel 426. A counterpart serial I/O controller 505 within the memory controller 401 receives the error information from the back channel and forwards the constituent phase error indications to the adaptive timing control circuit 501 which operates generally as described in reference to FIG. 10 to update, serially or in parallel, the delay control values TX0_Dval[9:0]-TX(k−1)_DVal[9:0] supplied to respective strobe delay circuits and sets of data delay circuits within each of the phase-compensating transmit circuits $503_0$-$503_{k-1}$. The adaptive timing control circuit 501 also outputs a data update signal (dUpdate) to the serial I/O controller 505 at the conclusion of each integration period. The serial I/O controller forwards the data update signal to the memory device where it is received by the serial I/O controller 530 and output as a data-update signal 532 to the oversampling data receivers 531. As discussed below, the data receivers 531 respond to the data-update signal 532 by updating their respective sets of phase error logic circuits, including latching updated phase error indications and resetting error counters therein.

Still referring to FIG. 14, the memory device 405 also includes an oversampling request receiver 535 having timing error detection circuitry to detect clock-to-DQS and clock-to-request timing errors. More specifically, the oversampling request receiver 535 samples the incoming request signals in response to the incoming master clock signal (Clk) and a quadrature-delayed version of the clock signal (i.e., Clk+90°) to recover requests that are forwarded to the access control circuitry and to generate clock-to-request phase error signals that indicate whether the clock signal leads or lags a desired sampling instant for the request signals. The oversampling request receiver 535 also samples timing signals exported from the oversampling data receivers $531_0$-$531_{k-1}$ (i.e., cleaned versions of the strobe signals applied within the oversampling data receivers 531, designated as sampling signals, sample0-samplek−1, in FIG. 14) in response to the master clock signal and quadrature-delayed master clock signal to generates clock-to-strobe phase error signals that indicate, for each of the data receiver sampling signals, whether the sampling signal leads or lags the clock signal. Further, in one embodiment, the timing error detection circuitry of the oversampling request receiver 535 includes logic to combine the error indications for the clock-to-request phase errors and the clock-to-strobe phase errors to yield a composite error phase indication that corresponds to the latest of the request and strobe signals. The clock-to-request phase error information, clock-to-strobe phase error information and composite phase error information is collectively referred to herein as the clock-based timing error information and is output from the oversampling request receiver 535 to the serial I/O controller 530 in the form of a set of valid/sign bit pairs designated CK/RQ/DQS_VS in FIG. 14. The clock-based timing error information is forwarded to the memory controller 401 via back channel 426 where it is received by counterpart serial I/O controller 505. The clock-to-strobe phase error information (DQS_VS) within the clock-based timing error information is supplied to adaptive timing controller 501 and applied to adjust the phase of the strobe signals. The composite phase error information (CK_VS) and clock-to-request phase error information (RQ_VS) is supplied to an adaptive timing controller 507 for the request and clock signals which, in response, generates updated delay control values, RQ_DVal [M−1:0] and CK_DVal, that are supplied to a phase-compensating request transmitter 509 (RTx) to adjust the phases of the transmitted clock and request signals.

Figure 15:
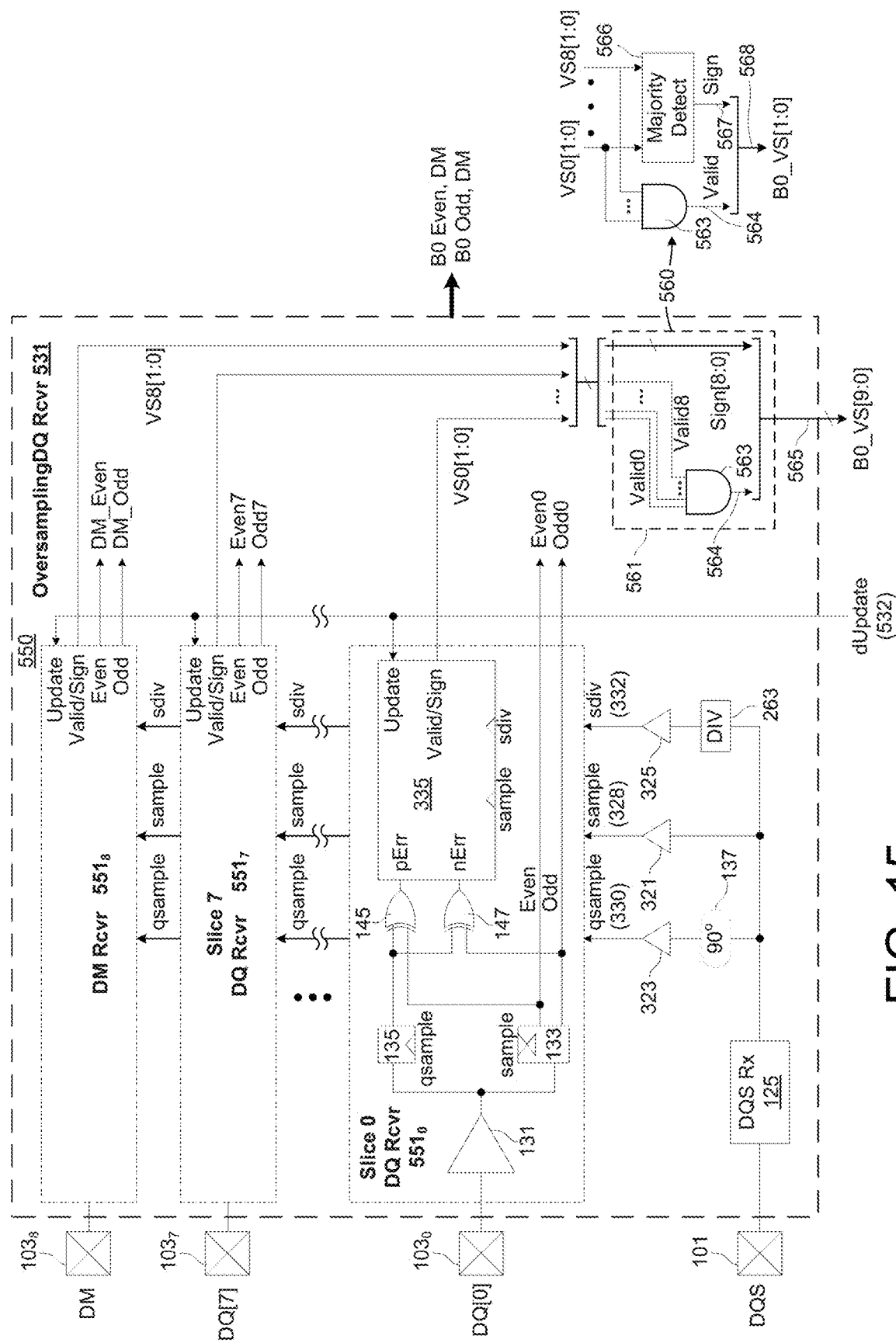
FIG. 15 illustrates an embodiment of an oversampling data receiver that may be used to implement each of the oversampling data receivers of FIG. 14.

FIG. 15 illustrates an embodiment of an oversampling data receiver 550 that may be used to implement each of the oversampling data receivers $531_0$-$531_{k-1}$ of FIG. 14. As shown, the oversampling data receiver 550 includes a data strobe receiver 125, data slice receivers $551_0$-$551_7$ and a quadrature delay element 137, divider circuit 263 and clock drivers 321, 323 and 325 to provide a sampling signal 328 (sample), quadrature sampling signal 330 (qsample) and subrate sampling signal 332 (sdiv) to each of data slice receivers $551_0$-$551_7$ as generally described in reference to FIG. 10, with each of the data slice receivers $551_0$-$551_7$ including an input amplifier, data and edge sampling circuits 133 and 135, error logic gates 145 and 147 and subrate phase error logic 335 that operate as described above to collectively recover a sequence of even and odd data bytes (Even[7:0] and Odd[7:0]) and corresponding phase error information, VS[7:0][1:0] from data signals received via nodes $103_0$-$103_7$. Note that the data strobe receiver 125 within the memory device 405 may be simplified relative to the counterpart data strobe receiver 125 within the memory controller, as the timing of the strobe enable signal may be enforced by establishing a fixed phase relationship between the master clock signal and the incoming data strobe signal. The oversampling data receiver 550 further includes a data mask receiver $551_8$ (DM Rcvr) which operates in generally the same manner as the data slice receivers $551_0$-$551_7$ to recover a sequence of even and odd data mask bits that correspond to the even and odd data bytes. As shown, a data-update signal 532 (dUpdate) from the serial I/O controller is provided to the update inputs of each of the data slice receivers $531_0$-$531_7$ and the data mask receiver $531_8$ and, when asserted, initiates an update operation within each receiver 531 to enable an updated valid/sign bit pair (i.e., phase error signal) to be latched or registered at the receiver output and to clear the internal error counters.

In one embodiment, the nine valid/sign bit pairs from data slice receivers $531_0$-$531_7$ and the data mask receiver $531_8$ are output to the serial I/O controller in parallel as byte-lane error information 565 (B0_VS[9:0]), thus permitting the corresponding delay control values maintained within the memory controller to be updated concurrently. To reduce consumption of backchannel bandwidth, the valid bits may be logically ANDed as performed by optional logic AND gate 563 to form a composite valid bit 564 that is used to qualify each of the sign bits. Also, instead of updating each of the data slice receivers $531_0$-$531_7$ and the data mask receiver $531_8$ simultaneously, the receivers 531 may be updated in round-robin fashion as described in reference to FIG. 10, with the error indications from each of the receivers 531 forwarded to the serial I/O controller via a multiplexed path rather than in parallel. Further, as shown at 560, instead of returning individual error sign bits to the memory controller as in embodiment 561, majority detection logic 566 may be provided to generate a composite sign bit 567 (i.e., as described in reference to FIG. 9) to be paired with composite valid bit 564 generated by logic AND gate 563 and thus form a two-bit byte-lane error value 568 (B0_VS [1:0]). In such an embodiment, the data strobe signal may be delayed within the memory controller to align the corresponding sampling signal 328 within each oversampling data receiver 550 of the memory device with the median of the desired sampling instants for the data slice receivers $551_0$-$551_7$ and mask signal receiver $551_8$.

Figure 16:
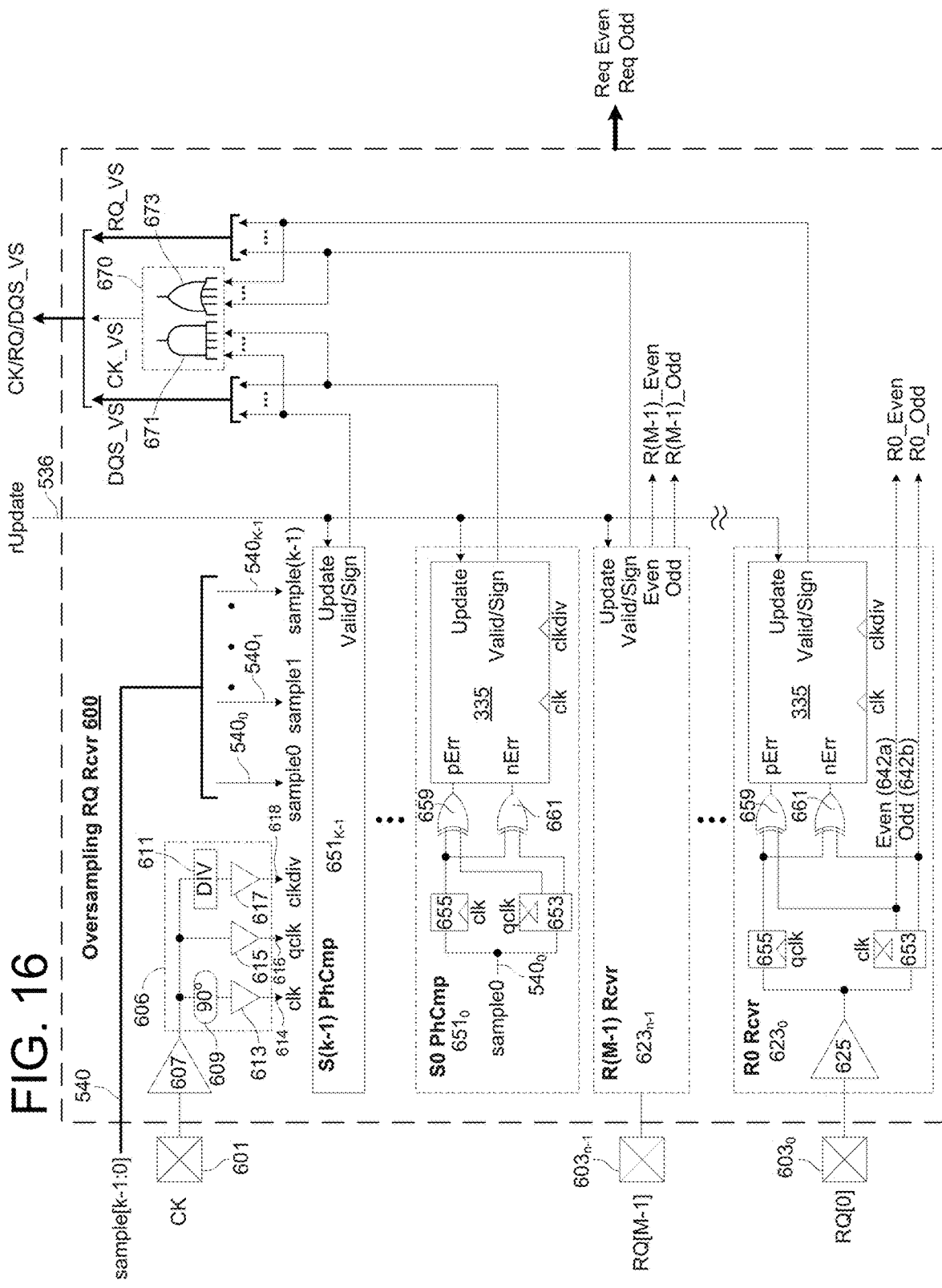
FIG. 16 illustrates an embodiment of an oversampling request receiver that may be used to implement the oversampling request receiver of FIG. 14.

FIG. 16 illustrates an embodiment of an oversampling request receiver 600 that may be used to implement the oversampling request receiver 535 of FIG. 14. As shown, the oversampling request receiver includes a clock reception and distribution circuit 606, a set of M request signal receivers $623_0$-$623_{M-1}$ (R0_Rcvr-R(M-1) Rcvr), a set of k clock/strobe phase comparators $651_0$-$651_{k-1}$ and compositing logic 670. The clock distribution circuit 606 includes an input amplifier 607 coupled to a clock input node 601 to receive the incoming master clock signal, Clk, and a quadrature delay element 609, divider circuit 611 and clock drivers 613, 615, 617 that operate to deliver a clock signal 614 (clk), quadrature clock signal 616 (qclk) and subrate clock signal 618 (clkdiv) to the request signal receivers 623 and clock/strobe phase comparators 651.

Each of the request signal receivers $623_0$-$623_{M-1}$ is coupled to receive a request signal (RQ[0]-RQ[M-1]) from is respective one of request input nodes $603_0$-$603_{M-1}$ and is implemented in generally the same manner as the data signal receivers described in reference to FIG. 15. Thus, as shown in the detail view of request signal receiver $623_0$, each request signal receiver includes an input amplifier 625 to forward the request signal from the request input node 603, request sampling circuit 627 to sample the incoming request signal in response to rising and falling edges of the clock signal 614 (or in response to rising edges of respective complementary components of clock signal 614 as in a differential clock arrangement), and an edge sampling circuit 629 to sample transitions in the incoming request signal in response to quadrature clock signal 616. The request samples generated within the M request signal receivers are output from the oversampling request receiver 600 as a sequence of even and odd request values, 642a and 642b. Each request value may itself constitute a memory access request (or configuration request or request for status) or may be combined with other request values to form a complete request, the latter arrangement allowing for transmission of packetized requests.

Within a given request signal receiver 623, each set of even and odd request samples and the intervening edge sample is provided, as a tri-sample, to error logic circuits 639 and 641 which generate positive and negative error signals, pErr and nErr, as described above. The positive and negative error signals are supplied to subrate phase error logic circuit 335 which also operates as described above in reference to FIGS. 7, 9 and 10 to accumulate the positive and negative error indications over time to produce an integrated, differential phase error. In the embodiment of FIG. 16, an updated phase error is latched at the valid/sign output of the subrate phase error logic circuit 335 at the conclusion of each integration period (marked by assertion of the request-update signal 536 (rUpdate) at the update input of each request signal receiver 623) as a valid bit and error sign bit (valid/sign) that indicate, respectively, whether a threshold number of phase errors have been detected during the integration period and whether more positive or negative phase errors were detected.

Each of the clock/strobe phase comparators $651_0$-$651_{k-1}$ receives the clock signal 614, quadrature clock signal 616, subrate clock signal 618, and a respective one of sampling signals $540_0$-$540_{k-1}$ (i.e., strobe signals) exported from the oversampling data receivers as shown in FIG. 14. Referring to the detail view of clock/strobe comparator $651_0$, the incoming sampling signal $540_0$ (sample0) is provided to data and edge sampling circuits 653 and 655 which are clocked by the quadrature clock signal 616 and clock signal 655, respectively. By this arrangement, the clock signal 614, which is nominally aligned with strobe signal transitions, is used to capture edge samples of the sampling signal $540_0$, while the quadrature clock signal 616 is used to capture data-level samples (i.e., analogous to data samples) of the sampling signal $540_0$. Error logic gates 659 and 661 are provided to compare the edge and data-level samples of each successive tri-sample and thus provide positive and negative-error signals to a subrate phase error logic circuit 335 to indicate whether transitions of clock signal 614 occur late or early relative to transitions of sampling signal $540_0$. As in the request signal receivers, the phase error logic 335 accumulates the positive and negative error indications over time to produce an integrated, differential phase error, latching a corresponding valid/sign bit pair at the valid/sign output and clearing internal counters in response to assertion of the request-update signal 536 (rUpdate).

Still referring to FIG. 16, the compositing logic 670 receives the valid/sign bit pairs from each of the request signal receivers $623_0$-$623_{M-1}$ and clock/strobe phase comparators $651_0$-$651_{k-1}$ and generates a composite valid/sign bit pair by logically ANDing the valid bits in AND gate 671 and logically ORing the sign bits in OR gate 673. By this arrangement, the composite sign bit (i.e., output of OR gate 673) corresponds to the latest of the sampling signals and request signals, and the composite valid bit indicates that the composite sign bit is valid when all the constituent sign bits are indicated to be valid. Though not specifically shown, the valid bits for the request signal receivers 623 may be ANDed to generate a composite valid bit for the set of request sign bits (e.g., to conserve backchannel bandwidth) and/or majority logic may be provided to generate a composite sign bit for the request signal receivers that represents a majority vote as to whether to advance or retard the phase of the request signals (or the clock signal) to achieve phase alignment between the request and clock signals. Similarly, the valid bits from the clock/strobe phase comparators 651 may be ANDed to generate a composite valid bit for the set of clock/phase sign bits and/or majority logic may be provided to generate a composite sign bit for the clock/strobe phase comparators 651.

Figure 17A:
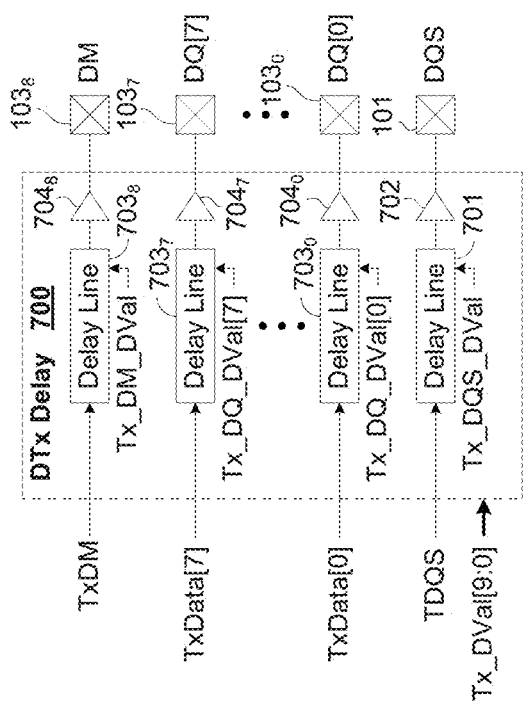
FIG. 17A illustrates an exemplary embodiment of a phase-compensating data/strobe transmitter that may be used to implement each of the phase-compensating transmitters of FIG. 14.

FIG. 17A illustrates an exemplary embodiment of a phase-compensating data/strobe transmitter 700 that may be used to implement each of the phase-compensating transmitters $503_0$-$503_{k-1}$ of FIG. 14. As shown, the transmitter 700 receives data byte TxData[7]-TxData[0] and mask bit TxDM as data inputs, a transmit strobe signal, TDQS, as a strobe signal input and transmit delay control values Tx_DVal[9:0] as delay control values for each of ten signals to be transmitted. The transmitter 700 includes respective delay lines 701 and $703_0$-$703_8$ to delay each of the input signals in accordance with a corresponding one of the ten delay control values. That is, the propagation delay through a respective one of delay lines $703_0$-$703_7$ is selected for each of the input data signals by a corresponding one of delay control values Tx_DQ_DVal[0]-Tx_DQ_DVal[7], the propagation delay through delay line $703_8$ for the data mask signal is selected according to delay control value Tx_DM_DVal and the propagation delay through the delay line 701 for the data strobe signal is selected according to delay control value Tx_DQS_DVal. By this operation, the phase of each of the signals transmitted in a given byte lane may be individually adjusted according to phase error information returned from the recipient memory device. As shown, the delayed data and mask signals are output from the memory controller via nodes $103_0$-$103_8$ by output drivers $704_0$-$704_8$, respectively. The delayed strobe signal is likewise output from the memory controller via node 101 by output driver 702.

Figure 17B:
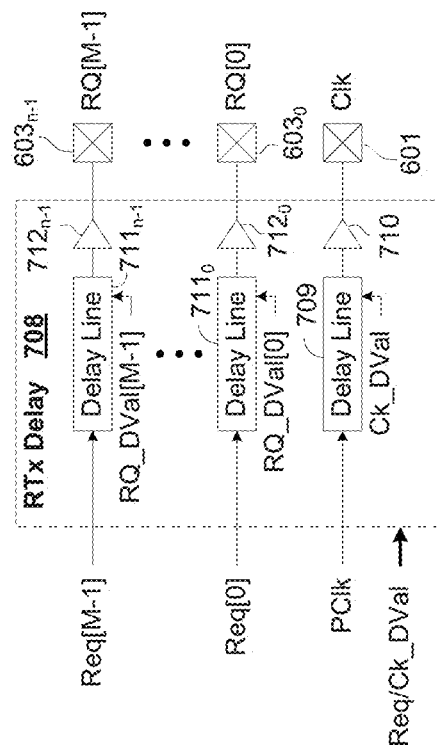
FIG. 17B illustrates an exemplary embodiment of a phase-compensating request/clock transmitter that may be used to implement the phase-adjusting request transmitter of FIG. 14.

FIG. 17B illustrates an exemplary embodiment of a phase-compensating request/clock transmitter 708 that may be used to implement the phase-adjusting request transmitter 509 of FIG. 14. As shown, transmitter 708 receives an M-bit request value Req[M−1:0] as a request input, the memory controller logic clock signal, PClk, as a clock input, and request/clock delay control values Req/Ck_DVal[M:0] as delay control values for each of M+1 signals to be transmitted. The transmitter 708 includes respective delay lines 709 and $711_0$-$711_{M-1}$ to delay each of the input signals in accordance with a corresponding one of the ten delay control values. That is, the propagation delay through a respective one of delay lines $711_0$-$711_{M-1}$ is selected for each of the input data signals by a corresponding one of delay control values RQ_DVal[0]-RQ_DVal[M−1] and the propagation delay through the delay line for the master clock signal is selected according to delay control value Ck_DVal. By this operation, the phase of the master clock signal and the phase of each of the signals transmitted via a given request signal line may be individually adjusted according to phase error information returned from the recipient memory device. As shown, the delayed request signals are output from the memory controller via nodes $603_0$-$603$M−1 by output drivers $712_0$-$712_{M-1}$, respectively, and the master clock signal is output via node 601 by output driver 710.

Figure 18:
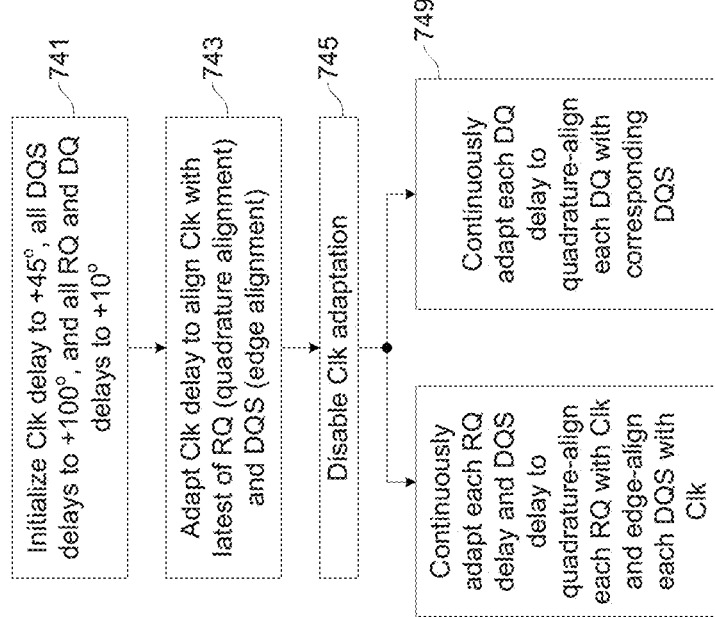
FIG. 18 illustrates an exemplary adaptive calibration sequence that may be applied within the memory system of FIG. 13 to establish a desired phase alignment between signals transmitted from the memory controller to the memory devices.

FIG. 18 illustrates an exemplary adaptive calibration sequence that may be applied within the memory system of FIG. 13 to establish a desired phase alignment between signals transmitted from the memory controller 401 to the memory devices 405. At 741, the clock delay is initialized to +45° (halfway to the nominal target of 90°), all data (DQ) and request (RQ) delays are initialized to +10° to provide headroom for phase advancement, and all strobe (DQS) delays are initialized to +100°, the nominal quadrature sampling point for the delayed-by-10° data signals. At 743, the master clock signal delay is adaptively adjusted to align the master clock signal with the latest of the request signals and strobe signals, and thus is shifted toward the +90° point for quadrature alignment with the request signals and edge alignment with the strobe signals. Referring to FIGS. 14, 16 and 17B, the memory controller applies the composite error indication, CK_VS (e.g., generated by compositing logic 670 within the request oversampler 600 of FIG. 16), to update the clock delay control value, Ck_DVal, until the desired alignment between the master clock signal (Clk) and latest of the request signals and data strobe signals is achieved. After the master clock signal has reached the desired alignment (e.g., determined by dithering of the composite error indication, CK_VS, adaptation of the master clock signal phase is halted or otherwise disabled as shown at 745, and adaptation of the phases of the request signals, strobe signals and data signals is commenced. More specifically, as shown at 747, each of the request signal delays and strobe signal delays are adaptively adjusted to achieve quadrature alignment between the request signals and the master clock signals and to achieve edge-alignment between the strobe signals and the master clock signal. Also, as shown at 749, each of the data signal delays is adaptively adjusted to achieve quadrature alignment between the sampling signal (i.e., delayed strobe signal) for a given byte lane and the corresponding mask and data signals. By continuing to adaptively calibrate the request, strobe and data signals through run-time operation of the memory system, phase differences between the various signals that might otherwise develop (e.g., due to temperature or voltage drift) are compensated for, and the desired phase alignment maintained.

Figure 19:
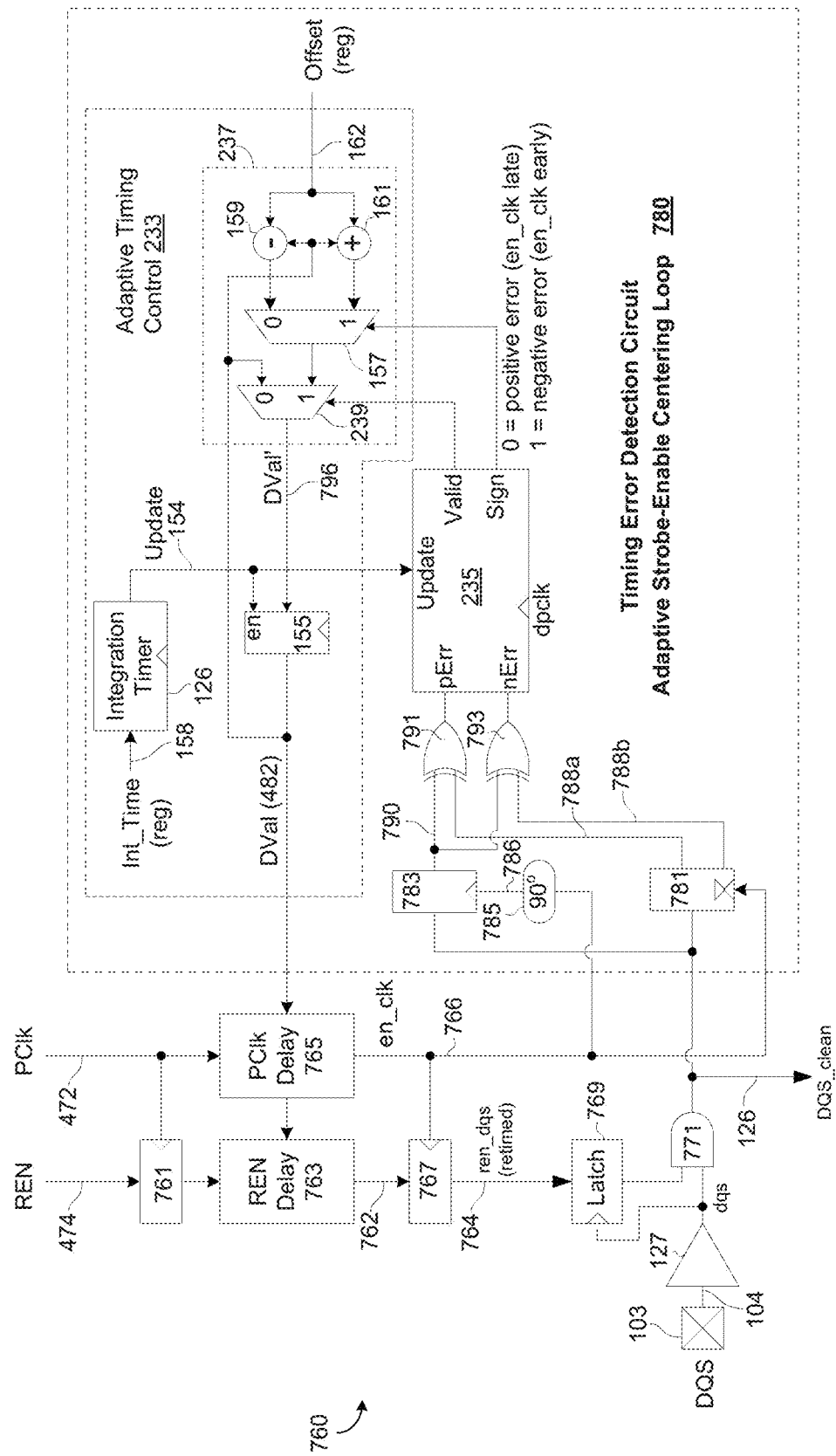
FIG. 19 illustrates an embodiment of a strobe enable circuit that may be used to implement the strobe enable circuit of FIG. 13.

FIG. 19 illustrates an embodiment of a strobe enable circuit 760 that may be used to implement the strobe enable circuit 451 of FIG. 13. A read-enable signal 474 (REN) is supplied from the memory controller core (e.g., from the request logic 413 shown in FIG. 12) at a time determined according to an expected data transmission from the memory subsystem. The read-enable signal 474 is synchronized with logic clock signal 472 (PClk) in flop-flop 761, then propagates through a variable-delay circuit 763 (REN Delay) to yield a phase-adjusted read-enable signal referred to herein as a strobe-enable signal 762. The logic clock signal 472 also propagates through a variable-delay circuit 765 (PClk Delay) to yield a delayed logic clock signal 766, dPClk. In the embodiment of FIG. 19, the strobe-enable signal 762 is synchronized with the delayed logic clock signal 766 in flip-flop 767 to account for delay mismatch between the variable-delay circuits 763 and 764, though such synchronization (and flip-flop 767) may be omitted in an alternative embodiment.

In one embodiment, the strobe-enable signal 764 is supplied to a transparent latch circuit 769 which operates by passing the strobe-enable signal 764 to a first input of AND gate 771 (i.e., an enable gate) during the preamble phase of a strobe signal 104 (DQS) which is received via strobe input node 103 and forwarded by input amplifier 127 to a second input of AND gate 771 and to the enable input of transparent latch circuit 769. By this arrangement, during the preamble phase when the strobe signal 104 transitions from a parked (i.e., mid-level state) to a low signal level, the latch circuit 769 is operated in transparent mode (i.e., due to the logic-low signal at its latch-enable input), passing the strobe-enable signal 764 to an input of AND gate 771 and thus ensuring that the first rising edge of the strobe signal 104 (i.e., the first data-indicating strobe signal transition) passes through AND gate 771 to appear in DQS_clean signal 126. As the strobe signal 104 goes high, the transparent latch transitions to a latch mode to latch the high state of the strobe-enable signal 764 until the next low-going edge of the strobe signal 104.

In one embodiment, each burst of data values timed by the strobe signal 104 includes an even number of symbols, in which the first data-indicating transition is a rising edge and the final data-indicating transition is a falling edge. Accordingly, the strobe signal 104 will be high just before a final, low-going strobe signal transition that corresponds to the final symbol in a burst sequence, and thus will latch a logic-high state of the strobe-enable signal 764 at the input of AND gate 771 and ensure that the final low-going transition of the strobe signal 104 will pass through AND gate 771 and appear in the DQS_clean signal 126, even if the strobe-enable signal 764 is deasserted slightly in advance of the final low-going transition of strobe signal 104. Note that this operation is particularly beneficial in the context of the automatic timing calibration performed by strobe enable circuit 760, which, as will be described in further detail below, operates to center the strobe-enable signal 764 between the start and end of the strobe signal preamble, and thus, because timed by the delayed logic clock signal 766, will be deasserted at a time that is substantially edge-aligned with the final low-going edge of the strobe signal 104. That is, in one embodiment, the strobe signal preamble is a logic clock cycle in duration so that, when the strobe-enable signal 764 is centered midway between the start and end of the strobe signal preamble, the strobe-enable signal 764 will be deasserted in a time band centered about the final low-going edge of the strobe signal 104, and potentially just slightly before the final low-going edge of the strobe signal 104. By latching the high state of the strobe-enable signal 764 at the input of AND gate 771 in advance of the final low-going edge of the strobe signal 104, the final low-going edge of the strobe signal 104 is ensured to pass through AND gate 771 and appear in the DQS_clean signal, even if the strobe-enable signal 764 is deasserted slightly prematurely.

Still referring to FIG. 19, the clean strobe signal 126 (DQS_clean) and delayed logic clock signal 766 are supplied to a timing error detection circuit 780 (also referred to herein as an adaptive strobe-enable centering loop) which samples the clean strobe signal 126 in response to the delayed logic clock signal 766 and in response to a quadrature-delayed logic clock signal 786 (i.e., generated by propagation of the delayed logic clock signal 766 through quadrature delay element 788) and thus generate data-level samples and edge samples of the clean strobe signal 126. That is, rising and falling edges of the delayed logic clock signal 766 (or rising edges of complementary components of a differential delayed clock signal 766) are applied to data-level sampling circuit 781 to generate samples of the clean strobe signal 126 on either side of a strobe signal transition (data-level samples 788a, 788b), while the quadrature-delayed logic clock signal 786 (generated by quadrature delay element 785) is supplied to edge sampling circuit 783 to capture samples of the clean strobe signal 126 as it transitions between upper and lower levels (i.e., edge samples 790). The data-level samples 788a/788b and edge samples 790 are provided as a sequence of tri-samples (i.e., successive data-level samples and intervening edge sample) to error logic gates 791 and 793 which generate positive and negative error signals, pErr and nErr, as described above in reference to FIG. 2. The positive and negative error signals are supplied to up/down inputs of phase error logic 795 which operates generally as described in reference to FIG. 6 to increase or decrease a differential error count, at each rising edge of the delayed logic clock signal 766, according to whether the tri-sample captured in the preceding delayed logic clock cycle indicates that the quadrature delayed logic clock signal 786 transitioned early (i.e., nErr) or late (pErr) relative to a transition of the clean strobe signal 126. In the embodiment of FIG. 19, the sign of the differential error count indicates whether a majority of the error indications indicate an early or late delayed logic clock signal 766 and is output to an adaptive timing control circuit 233 as an error sign value (Sign). The phase error logic 795 also includes circuitry to compare the total number of pErr and nErr assertions during a given integration period with a fixed or programmable threshold and to generate, according to the comparison result, a valid signal (Valid) which qualifies or disqualifies the corresponding error sign as described above. While not specifically shown, the phase error logic 795 may include additional circuitry to enable subrate loop operation as described in reference to FIG. 7.

The adaptive timing control circuit 233 includes an integration timer 153, delay control storage element 155 and delay value update circuit 237 (itself including multiplexers 157 and 239, and arithmetic operators 159 and 161) that operate generally as described in reference to FIG. 6 to increment, decrement or maintain without change the active delay control value 482 (DVal) at the conclusion of each integration period (signaled by update signal 154), thus producing an updated delay control value 796 (DVal'). As in the embodiment of FIG. 6, the delay value update circuit 237 outputs an updated delay control value 796 (DVal') that is adjusted by a fixed or programmed offset value 162, (which may be the same or different offset value than applied in like numbered references to the offset value 162 in embodiments described above) or, if the valid signal output from the phase error logic 795 is low, passes the active delay control value 482 through multiplexer 796 to be the updated delay control value 796. In any case, delay control value 796 is stored within the delay control storage element 155 at the subsequent assertion of the update signal 154, thus establishing a new (or same-value) active delay control value 482. By this operation, a negative feedback loop is established to adaptively adjust the phase delay of delayed clock signal 766, and therefore the strobe-enable signal 764, to maintain edge-alignment between the quadrature delayed logic clock signal 786 and the clean strobe signal 126. By aligning the quadrature delayed clock signal 786 and clean strobe signal 126 in this manner, a rising edge transition of the delayed logic clock signal 766, and thus the rising edge of the strobe-enable signal 764, is ensured to precede the first data-indicating edge of the incoming strobe signal 104 by approximately 90° and thus be centered substantially midway between the start and end of the strobe signal preamble. Accordingly, the strobe-enable signal 766 will enable the incoming strobe signal 104 to be passed as the clean strobe signal 126 at an appropriate time within the strobe signal preamble, regardless of phase drift between the incoming strobe signal 104 and logic clock signal 472 (PClk).

Figure 20:
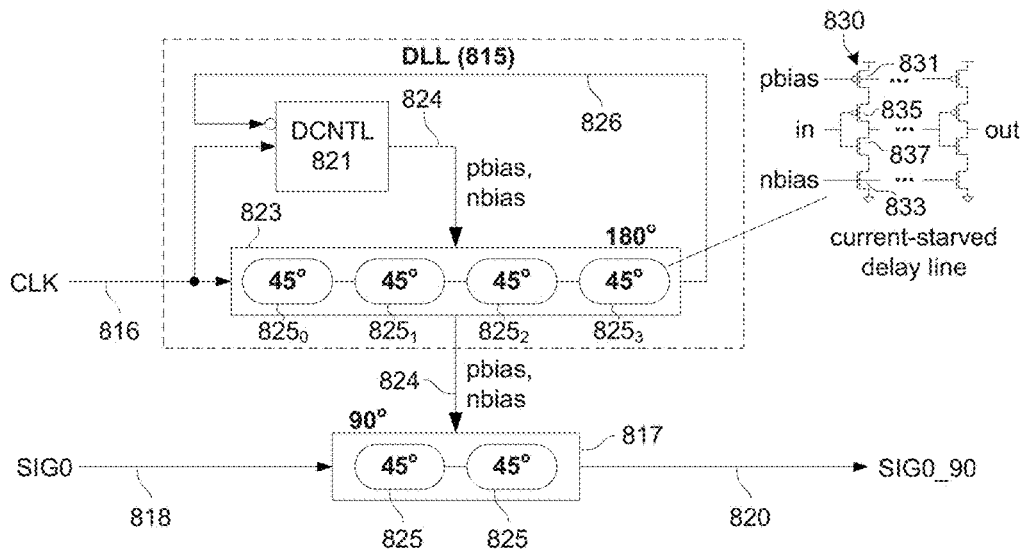
FIG. 20 illustrates a delay-locked loop circuit that may be used to generate control signals for establishing quadrature delay in a quadrature delay element.

FIG. 20 illustrates a delay-locked loop circuit 815 (DLL) that may be used to generate control signals for establishing quadrature delay in a quadrature delay element 817 such as the quadrature delay elements discussed in embodiments above. In one embodiment, the delay locked loop circuit 815 includes a delay line 823 implemented by a set of four daisy-chained delay elements $825_0$-$825_3$ (i.e., coupled in series, output-to-input) and a delay control circuit 821 coupled to receive a reference clock signal 816 (e.g., the logic clock signal 416 generated by clock generator 415 in the memory controller of FIG. 12, or the master clock signal (Clk) supplied to the memory devices 405 of FIG. 12) at a non-inverting input and a feedback clock signal 826 from the delay line 823 at an inverting input. In one embodiment, the delay control circuit 821 includes a phase detector (not specifically shown) to generate a logic low or high phase error signal according to whether the reference clock signal 816 leads or lags the feedback clock signal 826, and a bias control circuit (also not shown) to adjust positive-bias and negative-bias voltages 824 (p-bias, n-bias) supplied to each of the delay elements in response to the phase error signal. In the embodiment of FIG. 20, each of the delay elements $825_0$-$825_3$ is formed by a variable slew-rate inverter 830 having transistors 835 and 837 coupled in an inverter configuration and slew-rate control transistors 831 and 833 coupled respectively between the sources of transistors 835 and 837, and upper and lower supply voltages (e.g., $V_{DD}$ and ground). The gate terminals of the slew-rate control transistors 831 and 833 are coupled to receive the p-bias and n-bias signals, respectively, and thus operate to change the effective inverter supply voltage (i.e., voltage differential between the sources of inverter-configured transistors 835 and 837). More specifically, as n-bias is raised and p-bias is lowered, the voltage drop across the slew-rate control transistors 831 and 833 decreases, increasing the effective inverter supply voltage and thereby increasing the output slew rate of the inverter 830 to reduce input-to-output propagation delay. Conversely, when n-bias is lowered and p-bias raised, the slew-rate of the inverter 830 is decreased thereby increasing the inverter propagation delay.

Still referring to FIG. 20, the delay control circuit 821 closes a negative feedback loop that operates to adjust the p-bias and n-bias voltages 824 as necessary to achieve phase lock between a rising edge of the reference clock signal 816 and the falling edge of the delay-line output (i.e., feedback clock signal 826). By this operation, a net delay-line propagation delay of 180° is enforced by operation of the delay locked loop 815 with each of the four delay elements $825_0$-$825_3$ contributing a 45° delay to the 180° total. Further, by exporting the p-bias and n-bias voltages 824 to series coupled pairs of 45° delay elements 825 as shown in quadrature delay circuit 817, a 90° delay may be achieved between an input signal 818 (SIG0) and output signal 820 (SIG0_90). In alternative embodiments, more or fewer delay elements 825 may be provided within the delay line 823 to enable development of p-bias and n-bias voltages 824 that establish per-delay-element delays greater or less than 45°. Such delay elements may be used to construct delay circuits that exhibit more or less than 90° with such delay circuits applied, for example, in signaling systems that operate at data rates greater than the double data rate described above, or that otherwise have data eyes that are wider or narrower than 180° and thus have sampling points that are offset from edges of data eyes by angles other than 90°.

Figure 21:
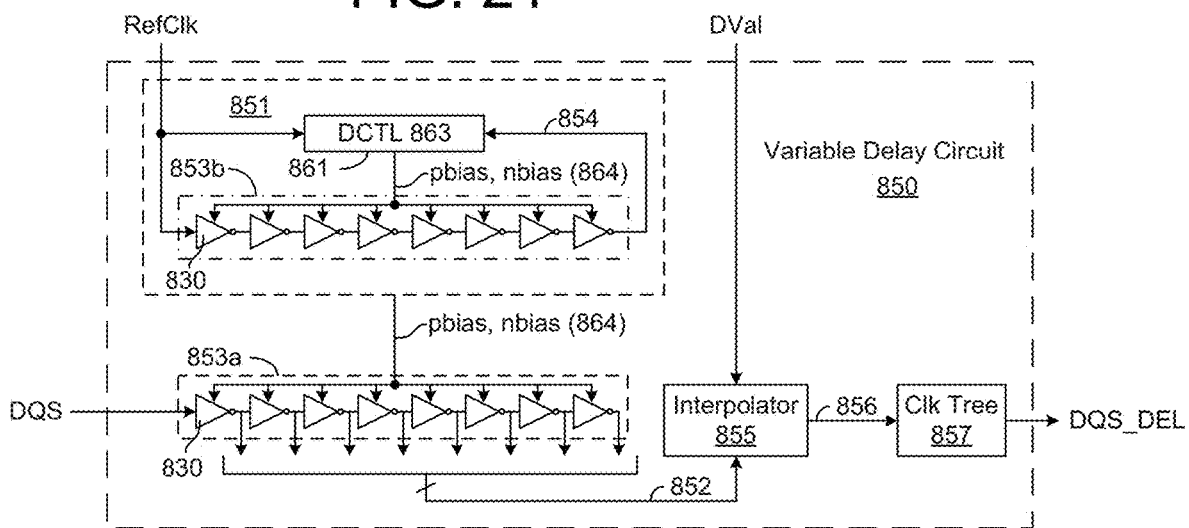
FIG. 21 illustrates an exemplary embodiment of a variable delay circuit that may be used to implement strobe delay circuits and data delay circuits.

FIG. 21 illustrates an embodiment of a variable delay circuit 850 that may be used, for example, to implement variable delay circuit 107 shown in FIGS. 1A, 2, 5, 6, 7, variable delay circuit 127 shown in FIG. 9, variable delay circuits 363 shown in FIG. 10 and the delay lines 701, 703, 709 and 711 shown in FIGS. 17A and 17B. The variable delay circuit 850 includes a delay locked loop 851, strobe delay line 853a, interpolator 855 and clock tree circuit 857. The delay locked loop 851 includes a delay line 853b and delay control circuit 863 both coupled to receive a reference clock signal, RefClk, which may be, for example, the logic clock signal, PClk, when the variable delay circuit 850 is included within a memory controller or the master clock signal, Clk, when included within a memory device. In the particular embodiment shown, the delay line 853b is implemented by a daisy-chained sequence of current-starved inverter elements 830 and thus forms a current-starved delay line generally as described in reference to FIG. 20. The delay control circuit 863 is coupled to receive the output of the delay line 853b (i.e., delayed clock signal 854) and the reference clock signal at respective phase detect inputs and includes circuitry to detect a phase difference between the clock signals and to adjust a delay control signal 864 (having component signals pbias and nbias in this example) that, in turn, adjusts the propagation delay through the inverter elements 830 in a direction counter to the phase difference, thus effecting a negative feedback loop that operates to enforce phase alignment between the delayed clock signal 854 and the reference clock signal. By this operation, a single-cycle delay (or half cycle delay depending on whether the reference clock signal is inverted relative to delayed clock signal 854) is established across the delay line 853b, with the delay through each of the component inverter elements being substantially equal to the reference clock period divided by the number of inverter elements 830. For example, as the particular embodiment shown includes eight inverter elements 830, the delay through each of the inverter elements 830 is approximately 45° or one-eighth of the reference clock period. More or fewer inverter elements 830 may be provided in alternative embodiments and/or other types of delay elements may be used.

Still referring to FIG. 21, the delay control signal 864 is exported from the delay-locked loop 851 to the strobe delay line 853a and used to control the propagation delay through inverter elements 830 therein. In one embodiment, the strobe delay line 853a is implemented by the same number of inverter elements 830 as delay line 853b and thus exhibits substantially the same single-cycle delay in response to a transition of an input signal and additionally yields a phase-shifted set of signal transitions that are progressively delayed, relative to one another, by a phase angle that corresponds to the reference clock period divided by the number of inverter elements 830 in the strobe delay line 853a. More specifically, the first inverter element 830 in the strobe delay line 853a is coupled to receive a strobe signal (DQS) so that each transition of the strobe signal appears at the output of the final inverter element 830 of the strobe delay line 853a one reference clock cycle later, and appears at outputs of the intermediate inverter elements 830 at phase increments of 360°/N, where N is the number of inverter delay elements. Thus, in the eight-element embodiment shown, each transition of the incoming strobe signal (e.g., a DQS_clean signal) produces a set of eight strobe signal transitions having phase offsets that range from 45° to 360° in 45° phase steps. The 360° may be viewed as being a 0° phase angle with a one clock cycle latency, so that the strobe delay line is considered to yield a set of phase-shifted strobe signals 852 that are delayed by angles of 0°, 45°, 90°, 135°, 180°, 225°, 250° and 315°. The phase-shifted strobe signals 852 are supplied to the interpolator 855 which includes logic to select a pair of the phase-shifted strobe signals according to vector-select component of a delay control value, DVal, and to interpolate between the selected pair of phase-shifted strobe signals 852 according to an interpolation component of the delay control value to generate phase-delayed strobe signal 856. As an example, in one embodiment, the delay control value is a nine-bit value in which the most significant three bits constitute the vector-select component (thus enabling selection of one of eight possible pairs of the phase-shifted strobe signals 852 bounding respective phase ranges 0-45°, 45-90°, 90-135°, 135-180°, 180-225°, 225-270°, 270-315° and 315-0°), and the least significant six bits constitute the interpolation component, thus enabling 64 interpolation steps between the selected pair of phase-shifted strobe signals. By this arrangement as the count value is incremented from 0 to a maximum value, the phase delay of the phase-delayed strobe signal is stepped from 0° (DVal=0 0000 0000b, where 'b' designates binary notation) to 359.3° (DVal=1 1111 1111b) in approximately 0.7° increments (i.e., $360/2^9$). More or fewer bits may be provided within the interpolation component of the delay control value in alternative embodiments with resulting increase or decrease in phase-step resolution. Also, fewer vector-select bits may be provided where fewer than eight pairs of phase-shifted delay signals are to be selected. For example, while a full 360° range of phase delays is provided by the delay control circuit 850, one or more inverter elements 830 may be omitted from strobe delay line 853a with corresponding reduction of interpolator circuitry and vector-select bits within the delay control value to implement a variable delay circuit having a phase range of less than 360°.

Still referring to FIG. 21, the phase delayed strobe signal 856 is supplied to the clock tree circuit 857 as shown, which operates to generate a number of instances of a delayed strobe signal, DQS_DEL, according to the desired signal fan-out. In an embodiment having a sufficiently low fan-out requirement for the delayed strobe signal, the clock tree circuit may be omitted and the phase-delayed strobe signal 856 itself applied as the delayed strobe signal.

Reflecting on the adaptive timing calibration operations discussed above, it can be seen that the phase updates carried out to compensate for phase drift between an incoming timing signal and a desired sampling instant are triggered by transitions in the incoming data signal. Consequently, during extended idle periods in which the incoming data signal does not transition (and thus the corresponding timing signal, if a strobe signal, also does not transition) or does not contain sufficient transition density, timing updates may not be performed, thus rendering the signaling system susceptible to gradual phase drift. In one embodiment, this circumstance is avoided by encoding outgoing data transmissions so that all possible data patterns to be transmitted include a number of transitions sufficient to support substantially continuous adaptive timing calibration. For example, in one embodiment, an 8-bit-to-10-bit encoder is provided to encode each 8-bit sequence to be transmitted on a given data line (or request line) into a 10-bit sequence having a desired number of data state transitions. After signal reception, the received 10-bit sequence may be decoded to restore the original 8-bit sequence. In an alternative embodiment, one or more of the devices in the signaling system (e.g., a master device in a master-slave signaling system, or all the devices or a designated one of the devices in a peer-to-peer signaling system) may monitor signal transmission on the data lines and issue occasional calibration transmissions as necessary to maintain an overall transition density that is sufficient to support a desired adaptive timing calibration rate and thus avoid undue phase drift. As a specific example, a memory controller within a memory system may detect a paucity of memory access requests from a host device (or a selection of a particular operating mode, such as a low power mode in which data transmission and reception is limited or temporarily suspended) and, in response, enter a self-directed mode in which the memory controller itself initiates periodic or occasional read and write operations (i.e., dummy reads and writes) within the memory subsystem to ensure sufficient transition density for adaptive timing calibration operations. In one embodiment, for example, the memory controller may select one or more unused storage locations within the memory subsystem (or one or more predetermined and/or programmably selected storage locations that are reserved for dummy read and write operations) and issue periodic write and read instructions directed to such storage locations. Alternatively, the memory controller may issue reads and writes to another resource within the memory device (e.g., a status register or even a non-existent location indicated by a particular out-of-bound or otherwise specially-coded address value or request code). Further any such read and write operations may be hidden under one or more other maintenance operations (i.e. performed concurrently therewith to reduce impact on memory subsystem availability) including, for example and without limitation, refresh operations, signal driver calibration operations, equalization calibration operations, and so forth.

It should be noted that the various circuits disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other suitable formats and languages. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present invention. In some instances, the terminology and symbols may imply specific details that are not required to practice the invention. For example, the interconnection between circuit elements or circuit blocks may be shown or described as multi-conductor or single conductor signal lines. Each of the multi-conductor signal lines may alternatively be single-conductor signal lines, and each of the single-conductor signal lines may alternatively be multi-conductor signal lines. Signals and signaling paths shown or described as being single-ended may also be differential, and vice-versa. Similarly, signals described or depicted as having active-high or active-low logic levels may have opposite logic levels in alternative embodiments. As another example, circuits described or depicted as including metal oxide semiconductor (MOS) transistors may alternatively be implemented using bipolar technology or any other technology in which a signal-controlled current flow may be achieved. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. The term "exemplary" is used to express an example, not a preference or requirement.

Various aspects of the subject matter described herein are set forth, for example and without limitation, in the following numbered clauses:

1. A signaling system comprising:
    a first integrated circuit (IC) device to receive a data signal and a strobe signal and having circuitry to sample the data signal at times indicated by the strobe signal to generate phase error information and circuitry to output the phase error information from the first IC device; and
    a second IC device to output the data signal and the strobe signal to the first IC device, the second IC device having delay circuitry to generate the strobe signal by delaying an aperiodic timing signal for a first time interval and timing control circuitry to receive the phase error information from the first IC device and adjust the first time interval in accordance with the phase error information.
2. The signaling system of clause 1 wherein the circuitry to sample the data signal at times indicated by the strobe signal to generate phase error information comprises:
    a data sampling circuit to sample the data signal in response to the strobe signal to generate a sequence of data samples; and
    an edge sampling circuit to sample the data signal in response to a phase-shifted version of the strobe signal to generate a sequence of edge samples.
3. The signaling system of clause 2 wherein the circuitry to sample the data signal at times indicated by the strobe signal to generate phase error information further comprises circuitry to compare each pair of the data samples with an intervening one of the edge sample to generate the phase error information.
4. The signaling system of clause 1 wherein the delay circuitry comprises an input to receive a delay control value from the timing control circuitry, and circuitry to apply the delay control value to establish the first time interval.
5. The signaling system of clause 4 wherein the timing control circuitry includes a delay control update circuit to increase or decrease the delay control value according to the phase error information received from the first IC.
6. A method of operation within a signaling system, the method comprising:
    generating a strobe signal within a first integrated (IC) device by delaying an aperiodic timing signal for a first time interval;
    outputting the strobe signal and a data signal from the first IC device to a second IC device; sampling the data signal within the second IC device at times indicated by the strobe signal to generate phase error information;
    outputting the phase error information from the second IC device to the first IC device; and
    adjusting the first time interval within the first IC device in accordance with the phase error information.
7. The method of clause 6 wherein sampling the data signal within the second IC device at times indicated by the strobe signal to generate phase error information comprises:
    sampling the data signal in response to the strobe signal to generate a sequence of data samples; and
    sampling the data signal in response to a phase-shifted version of the strobe signal to generate a sequence of edge samples.
8. The method of clause 7 wherein sampling the data signal within the second IC device at times indicated by the strobe signal to generate phase error information further comprises comparing each of the edge samples with one of the data samples captured before the edge sample and with one of the data samples captured after the edge sample, and signaling a first type of timing error for each edge sample that does not match the data sample captured before the edge sample and a second type of timing error for each edge sample that does not match the data sample captured after the edge sample.
9. The method of clause 8 wherein sampling the data signal within the second IC device at times indicated by the strobe signal to generate phase error information further comprises generating a phase error signal in either a first state or a second state according to whether more timing errors of the first type or the second type are signaled over an error detection interval.
10. A memory controller comprising:
    a first delay circuit to delay an aperiodic timing signal for a first interval to generate a strobe signal;
    a transmit circuit to output the strobe signal and a corresponding data signal to a memory device;
    an interface to receive error information from the memory device, the error information indicating a phase error between the strobe signal and the data signal; and
    timing control circuitry to adjust the first interval in response to the error information.
11. The memory controller of clause 10 wherein the first delay circuit comprises an input to receive a delay control value from the timing control circuitry, and circuitry to apply the delay control value to establish the first interval.
12. The memory controller of clause 11 wherein the timing control circuitry includes a delay control update circuit to increase or decrease the delay control value according to the error information received from the memory device.
13. The memory controller of clause 10 further comprising a data delay circuit to delay the data signal for a second time interval before the data signal is output to the memory device.
14. The memory controller of clause 13 wherein the timing control circuit comprises circuitry to adjust the second interval in response to the error information.
15. A method of operation within a memory controller, the method comprising:
    delaying an aperiodic timing signal for a first interval to generate a strobe signal; outputting the strobe signal and a corresponding data signal to a memory device;
    receiving error information from the memory device, the error information indicating a phase error between the strobe signal and the data signal; and
    adjusting the first interval based on the error information.
16. The method of clause 15 further comprising:
    delaying the data signal for a second interval before outputting the data signal to the memory device; and
    adjusting the second interval based on the error information.
17. The method of clause 15 wherein delaying the aperiodic timing signal for a first interval comprises establishing, within a delay circuit, a propagation delay that corresponds to the first interval.

18. The method of clause 15 wherein adjusting the first interval based on the error information comprises increasing or decreasing the propagation delay within the delay circuit.
19. The method of clause 18 wherein increasing or decreasing the propagation delay within the delay circuit comprises incrementing or decrementing a delay control value that is applied within the delay circuit to control the propagation delay.
20. A memory controller comprising:
   means for delaying an aperiodic timing signal for a first interval to generate a strobe signal;
   means for outputting the strobe signal and a corresponding data signal to a memory device;
   means for receiving error information from the memory device, the error information indicating a phase error between the strobe signal and the data signal; and
   means for adjusting the first interval based on the error information.

While the invention has been described with reference to specific embodiments thereof, it will be evident that various modifications and changes may be made thereto without departing from the broader spirit and scope of the invention. Accordingly, the specification and drawings are to be regarded in an illustrative rather than a restrictive sense.

What is claimed is:
1. An integrated circuit (IC) memory controller, comprising:
   a timing signal pin to receive a timing signal;
   a data pin to receive data during live data transfer operations and having sampling circuitry;
   a timing controller coupled to the timing signal pin and the data pin, the timing controller operative during an initialization mode to determine whether devices generating the data support an adaptive calibration mode associated with the live data transfer operations, the initialization mode occurring outside of the live data transfer operations, the timing controller operative during the adaptive calibration mode to detect a phase difference between a phase of the timing signal and a phase of the data, and to adjust the phase of the data to a calibrated phase based on the phase difference; and
   wherein the sampling circuitry samples the data based on the calibrated phase.
2. The integrated circuit (IC) memory controller of claim 1 wherein:
   the data pin includes a first adjustable delay circuit responsive to the timing controller to delay the data by a delay value based on the phase difference.
3. The integrated circuit (IC) memory controller of claim 1 wherein the detected phase difference is based on a differential phase error signal corresponding to a phase difference between a phase of the timing signal and a phase of the data.
4. The integrated circuit (IC) memory controller of claim 3 wherein the differential phase error signal comprises a difference between a positive edge bit error rate (BER) that indicates a rate of errors in sampling early and a negative edge BER that indicates a rate of errors in sampling late.
5. The integrated circuit (IC) memory controller of claim 1 wherein the timing signal is a strobe signal.
6. The integrated circuit (IC) memory controller of claim 1 wherein:
   the timing controller is operative to adaptively adjust the phase of the timing signal based on a most recently generated calibrated phase.

7. The integrated circuit (IC) memory controller of claim 1 wherein the timing controller includes a multiplexer having an input corresponding to the phase of the data, the multiplexer having an output to provide the calibrated phase in a sequenced manner with other calibrated phases associated with other data.
8. A method of operation in an integrated circuit (IC) memory controller, comprising:
   receiving a timing signal, the timing signal exhibiting a first phase;
   receiving data during live data transfer operations, the data exhibiting a second phase;
   during an initialization mode
      determining whether devices generating the data support an adaptive calibration mode associated with the live data transfer operations, the initialization mode occurring outside of the live data transfer operations;
   during the adaptive calibration mode
      detecting a phase difference between the first phase of the timing signal and the second phase of the data,
      adjusting the second phase of the data to a calibrated phase based on the phase difference, and
      sampling the data based on the calibrated phase.
9. The method of claim 8, wherein the adjusting the second phase includes delaying the data with an adjustable delay circuit by a delay value based on the phase difference.
10. The method of claim 8 wherein detecting the phase difference comprises evaluating a differential phase error signal representing the phase difference.
11. The method of claim 10, wherein the differential phase error signal comprises a difference between a positive edge bit error rate (BER) that indicates a rate of errors in sampling early and a negative edge BER that indicates a rate of errors in sampling late.
12. The method according to claim 8 wherein the timing signal comprises a strobe signal.
13. The method according to claim 8, further comprising:
   adaptively adjusting the first phase of the timing signal based on a most recently generated calibrated phase.
14. The method according to claim 8, further comprising time-multiplexing the second phase and other data phases to generate a sequence of calibrated phases.
15. A method of operation in an integrated circuit (IC) memory controller, comprising:
   during an initialization mode of operation,
      determining whether devices generating data support an adaptive calibration mode associated with live data transfer operations, the initialization mode occurring outside of the live data transfer operations;
   during the adaptive calibration mode of operation that occurs during the live data transfer operations,
      calibrating a data path delay value for delaying data associated with a data path, the calibrating for the data path done in a sequential manner with respect to other data paths, the data path delay value being calibrated by
         receiving data from a given data path, the data exhibiting a data signal phase,
         detecting a phase difference between a timing signal phase and the data signal phase, and
         determining an updated delay value based on the detected phase difference; and
      sampling data from the data path based on the determined updated delay value for the data path.

16. The method of claim 15, further comprising:
during the initialization mode of operation prior to the adaptive calibration mode of operation, calibrating an initial timing path delay value and an initial data path delay value.

17. The method of claim 15, wherein detecting the phase difference comprises evaluating a differential phase error signal representing the phase difference.

18. The method of claim 17, wherein the differential phase error signal comprises a difference between a positive edge bit error rate (BER) that indicates a rate of errors in sampling early and a negative edge BER that indicates a rate of errors in sampling late.

19. The method of claim 15, further comprising:
calibrating a timing path delay value based on a phase difference between the timing signal phase and data associated with the data path, the timing path delay value to adjust the timing signal phase to a calibrated timing signal phase.

20. The method of claim 15, further comprising:
after determining an updated delay value based on the detected phase difference, applying the updated delay value to delay the data received via the data path.

\* \* \* \* \*